(12) United States Patent
Towns et al.

(10) Patent No.: US 6,861,502 B1
(45) Date of Patent: Mar. 1, 2005

(54) POLYMERS, THEIR PREPARATION AND USES

(75) Inventors: Carl Robert Towns, Essex (GB); Richard O'Dell, Herts (GB); Stephen John Martin O'Connor, Cambridge (GB)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 09/936,295

(22) PCT Filed: Mar. 13, 2000

(86) PCT No.: PCT/GB00/00911

§ 371 (c)(1),
(2), (4) Date: Feb. 12, 2002

(87) PCT Pub. No.: WO00/55927

PCT Pub. Date: Sep. 21, 2000

(30) Foreign Application Priority Data

Mar. 12, 1999 (GB) .............................. PCT/GB99/00741

(51) Int. Cl.⁷ .................... C08G 61/00; C08L 39/04; C09K 11/06; B32B 9/00; H05B 33/14

(52) U.S. Cl. .................. 528/422; 528/373; 528/377; 528/397; 528/423; 528/425; 257/40; 313/483; 313/506; 525/204; 525/206; 525/280; 525/284; 428/690; 428/917

(58) Field of Search ................................ 528/422, 423, 528/425, 397, 377, 373, 394, 488; 525/204, 206, 280, 284; 257/40, 79, 88, 103, 113; 313/483, 505–506, 504; 428/690, 917

(56) References Cited

U.S. PATENT DOCUMENTS

| | | | | | |
|---|---|---|---|---|---|
| 5,645,948 | A | * | 7/1997 | Shi et al. ..................... | 428/690 |
| 5,728,801 | A | * | 3/1998 | Wu et al. ..................... | 528/422 |
| 5,777,070 | A | | 7/1998 | Inbasekaran et al. ....... | 528/394 |
| 5,929,194 | A | | 7/1999 | Woo et al. ................... | 528/229 |
| 5,968,674 | A | * | 10/1999 | Hsieh et al. ................. | 428/690 |
| 5,998,045 | A | * | 12/1999 | Chen et al. .................. | 428/690 |
| 6,107,452 | A | * | 8/2000 | Miller et al. ................. | 528/422 |
| 6,169,163 | B1 | | 1/2001 | Woo et al. ................... | 528/397 |
| 6,204,515 | B1 | * | 3/2001 | Bernius et al. .............. | 257/40 |
| 6,309,763 | B1 | | 10/2001 | Woo et al. ................... | 428/690 |
| 6,353,072 | B1 | * | 3/2002 | Towns et al. ................ | 528/394 |
| 6,353,083 | B1 | | 3/2002 | Inbasekaran et al. ....... | 528/295 |
| 6,512,070 | B2 | | 1/2003 | Hawker et al. .......... | 526/347.1 |
| 6,512,082 | B2 | * | 1/2003 | Towns et al. ................ | 528/394 |
| 6,551,727 | B2 | * | 4/2003 | Towns et al. ................ | 428/690 |
| 6,605,823 | B1 | * | 8/2003 | Pichler et al. ................ | 257/40 |
| 2003/0045642 | A1 | * | 3/2003 | Wu et al. ..................... | 525/204 |
| 2003/0186079 | A1 | * | 10/2003 | Towns et al. ................ | 428/690 |
| 2003/0224205 | A1 | * | 12/2003 | Li et al. ...................... | 428/690 |

FOREIGN PATENT DOCUMENTS

| | | |
|---|---|---|
| JP | 11-60660 | 3/1999 |
| WO | WO 96/20253 | 7/1996 |

OTHER PUBLICATIONS

"Nature", vol. 397, pp. 121–128 (Jan. 14, 1999), A. H. Friend et al, "Electroluminescence in Conjugated Polymers".*

Hiroyasu, "Organic El Element", Patent Abstracts of Japan of JP 09–082473, Mar. 28, 1997.

Yang et al., "Poly(1,4–Phenylene–1,2–Diphenyvinylene) and Tris(8–Quinolinolato)Aluminum Bilayer Light–Emitting Diodes", Polymers for Advanced Technologies, vol. 8, No. 7, pp. 431–436, Jul. 1, 1997.

Garten et al., "Efficient Blue LEDs from a Partially Conjugated SI–Containing PPV Copolymer in a Double–Layer Configuration", Advanced Materials, vol. 9. No. 2, pp. 127–131, Feb. 1, 1997.

Hosokawa et al., "Highly Efficient Blue Electroluminescence from a Distyrlarylene Emitting Layer with a New Dopant", Applied Physics Letters, vol. 67, No. 26, Dec. 25, 1995.

* cited by examiner

Primary Examiner—P. Hampton Hightower
(74) Attorney, Agent, or Firm—Susan Moeller Zerull

(57) ABSTRACT

An organic polymer having a plurality of regions along the length of the polymer backbone and comprising two or more of the following a first region for transporting negative charge carriers and having a first bandgap defined by a first LUMO level and a first HOMO level; and a second region for transporting positive charge carriers and having a second bandgap defined by a second LUMO level and a second HOMO level; and a third region for accepting and combining positive and negative charge carriers to generate light and having a third bandgap defined by a third LUMO level and a third HOMO level, wherein each region comprises one or more monomers and the quantity arrangement of the monomers in the organic polymer is selected so that the first, second and third bandgaps are distinct from one another in the polymer.

76 Claims, 1 Drawing Sheet

POLYMERS, THEIR PREPARATION AND USES

CROSS REFERENCE TO RELATED APPLICATIONS

The present invention relates to an organic polymer and uses thereof such as in an optical device, and to a process for preparing such a polymer.

BACKGROUND OF THE INVENTION

Organic electroluminescent devices are known which employ an organic material for light emission. For example, WO 90/13148 describes such a device comprising a semiconductor layer comprising a polymer film which comprises at least one conjugated polymer situated between electrodes. The polymer film in this case comprises a poly(paraphenylene vinylene) (PPV) film which is capable of light emission when electrons and holes are injected therein. Other polymer layers capable of transporting holes or transporting electrons to the emissive layer may be incorporated into such devices.

For organic semiconductors important characteristics are the binding energies, measured with respect to the vacuum level of the electronic energy levels, particularly the "highest occupied molecular orbital" (HOMO) and "lowest unoccupied molecular orbital" (LUMO) levels. These can be estimated from measurements of photoemission and particularly measurements of the electrochemical potentials for oxidation and reduction. It is well understood in the field that such energies are affected by a number of factors, such as the local environment near an interface, and the point on the curve (peak) from which the value is determined. Accordingly, the use of such values is indicative rather than quantitative.

FIG. 1 shows a cross section of a typical device for emitting light. FIG. 2 shows the energy levels across the device. The anode 1 is a layer of transparent indium-tin oxide (ITO) with a work function of 4.8 electron volts. The cathode 2 is a LiAl layer with a work function of 2.4 electron volts. Between the electrodes is a light emissive layer 3 of PPV, having a LUMO energy level 5 at around 2.7 electron volts and a HOMO energy level 6 at around 5.2 electron volts. Holes and electrons that are injected into the device recombine radiatively in the PPV layer. An important feature of the device is the hole transport layer 4 of polyethylene dioxythiophene (PEDOT). This polymer is disclosed in EP 0686662. This provides an energy level at about 5.2 electron volts which helps the holes injected from the ITO to reach the HOMO level in the PPV.

It should be noted here that values stated for energy levels, work functions etc. are generally illustrative rather than absolute. For example, the work function of ITO can vary widely. It is well known that the value can depend on ITO deposition process and history.

Known device structures also may have an electron transport layer situated between the cathode 2 and the light emissive layer 3. This provides an energy level which helps the electrons injected from the cathode to reach the LUMO level of the material constituting the light emissive layer. Suitably, the electron transporting layer has a LUMO energy level between the LUMO energy levels of the cathode and the light emissive layer or matched to the LUMO energy level of the light emissive layer.

One disadvantage associated with multiple layered devices is that where the layers are deposited from solution it is difficult to avoid one layer being disrupted when the next is deposited, and problems can arise with voids or material trapped between the increased number of interlayer boundaries. Appl.Phys.Lett. 51, 913–915 (1987) is concerned with organic thin-film electroluminescence. Devices disclosed in this document consist of a hole-transporting layer of an aromatic diamine and an emissive layer of 8-hydroxyquinoline aluminium. ITO is used as the hole-injecting electrode and a magnesium-silver alloy as the electron-injecting electrode.

As is disclosed in Nature, 397, 121–128 (1999) TPD is used as a hole transport layer. However, this molecular material has the disadvantages associated with using small molecule layers in a device. Similarly, this document discloses that PBD is known as an electron transport layer. Again, this has the disadvantageous device characteristics associated with using small molecule layers as compared with polymer layers in electroluminescent devices.

The use of polymers in general in light emitting devices, and particularly as charge transport materials is very attractive. Polymers show excellent device characteristics. These device characteristics include good efficiency, processability and device lifetime.

Poly(arylamines) are disclosed in U.S. Pat. No. 5,728,801 as useful charge transport layers in light-emitting diodes. This document further discloses that triarylamines are used as charge transport materials, specifically positive charge transport materials, because they are easily oxidised to the corresponding radical cation. The usefulness of the possibility of using these polymers in film form is discussed in this document.

In view of the above, there still remains a need to simplify the structure of light emitting devices, thus, simplifying manufacturing processes and reducing production costs.

SUMMARY OF THE INVENTION

The present invention provides an electroluminescent device comprising a first charge carrier injecting layer for injecting positive charge carriers, a second charge carrier injecting layer for injecting negative charge carriers and a light emissive layer located between the charge carrier and injecting layers and comprising a mixture of a first component for accepting positive charge carriers from the first charge carrier injecting layer, a second component for accepting negative charge carriers from the second charge carrier injecting layer and a third organic light emissive component for accepting and combining charge carriers from the first and second components to generate light.

Two or more of the components of the emissive layer may be provided as functional chemical units or moieties of a single molecule. Any further components of the layer may be provided by one or more further molecules physically mixed with the said single molecule. Where a single molecule provides more than one component those components could be combined as a copolymer (e.g. in main chain, side chain, block or random form). Where a single molecule provides more than one component the components provided by that molecule preferably include the third component. Suitably the third component and at least one of the first and second components are provided as a copolymer.

According to a first aspect of the present invention there is provided an organic polymer having a plurality of regions along the length of the polymer backbone and comprising two or more of the following:
(i) a first region for transporting negative charge carriers and having a first bandgap defined by a first LUMO level and a first HOMO level; and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level.

wherein each region comprises one or more monomers and the quantity and arrangement of the monomers in the organic polymer is selected so that the first, second and third bandgaps are distinct from one another in the polymer.

The organic polymer provided by the present invention solves the problems of the prior art by reducing the total number of layers and polymer components required in a light-emitting device. Instead of requiring a separate polymer to act as a negative charge transport material, a separate polymer to act as a positive charge transport material, and a separate polymer to act as a light emissive material, the present polymer is capable of acting as two or more of these. This reduces the number of components required in a light-emitting device. In the case where each differently functioning component forms a separate layer in the device, this reduces the number of layers. In the case where differently functioning components are blended in a single layer, this reduces the number of components needed in the blend.

For the purposes of the present invention, the term "region" may be taken to mean a segment or portion of the polymer chain. A "region" may comprise one or more monomers. Preferably each "region" comprises two or more monomers. Where the "region" comprises two or more monomers, the region preferably consists of no more than two different monomer species, specifically, a single species of monomer or two different species of monomer.

The first LUMO level should be such that the first region is capable of transporting negative charge carriers to an emissive material, which may or not be the third region. The second HOMO level should be such that the second region is capable of transporting positive charge carriers to an emissive material, which may or may not be the third region. The third LUMO level and the third HOMO level should be such that light of a desirable wavelength is emitted when positive and negative charge carriers are accepted and combined in the third region to generate light.

Referring to the third region, the energy difference between the third LUMO level and the third HOMO level defines the third bandgap.

The required functionality of a polymer according to the present invention may be characterised in numerous ways.

Firstly, on a simplistic level, a polymer will have the required functionality if an electroluminescent device is capable of emitting light when the polymer is introduced at an appropriate location in the device. For example, a polymer belonging to the first sub-group described below will be capable of emitting light when introduced as a layer between an anode and a cathode in an electroluminescent device. An electroluminescent device will be capable of emitting light when a polymer according to the second sub-group described below is blended with a suitable emissive material and this blend is introduced as a layer between an anode and a cathode in the electroluminescent device. An electroluminescent device will be capable of emitting light when a polymer falling within the third sub-group described below is introduced as a layer, when blended with an appropriate hole transporting material, between an anode and a cathode in the electroluminescent device. An electroluminescent device will be capable of emitting light when a polymer falling within the fourth sub-group defined below is introduced as a layer, when blended with an appropriate electron transporting material, between an anode and a cathode in the electroluminescent device.

Without wishing to be bound by theory, a further method of characterising the required functionality of a polymer according to the present invention is by analysis of a cyclic voltamagram of the polymer. The cyclic voltamagram (C-V graph) will indicate to the skilled person to some extent that the single polymer has two or more different oxidation potentials. Usually, these different oxidation potentials would manifest themselves on the graph as peaks or troughs in the C-V curve. The peaks or troughs vary from being sharp to very shallow. The existence of different oxidation potentials within a single polymer would indicate to the skilled person that the polymer is capable of having multiple functions with regard to charge transport and charge combination in an electroluminescent device. Accordingly, the cyclic voltamagram of a polymer is a way of predicting how a polymer could function electronically if introduced appropriately into an electroluminescent device. The actual electronic functioning of the polymer in an electroluminescent device would depend on factors such as where in the device a layer of the polymer was introduced.

According to a second aspect of the present invention, there is provided an electroluminescent device comprising at least one layer of a polymer according to the present invention.

The first region should be selected so that the first LUMO level or work function of the first region is matched as closely as possible to the LUMO level of the light-emissive material, when the polymer according to the present invention is used in an electroluminescent device. The light-emissive material may be a separate polymer or may be a third region in the polymer comprising the first region. The second HOMO level or work function of the second region should be selected so that it is matched as closely as possible to the HOMO level of the light-emissive material, when the polymer according to the present invention is used in an electroluminescent device. The third region should be selected so that the bandgap defined by the third LUMO level and the third HOMO level is such that light of a desired wavelength is emitted when positive and negative charge carriers are combined in the third region to generate light, when a polymer comprising the third region is used in an electroluminescent device.

BRIEF DESCRIPTION OF THE DRAWINGS

The present invention will be described now in more detail with reference to the following drawings, in which.

DETAILED DESCRIPTION

Figure 1:
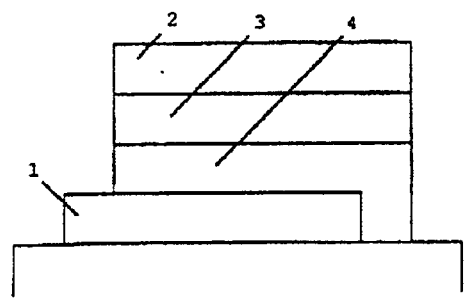
FIG. 1 shows a general device structure.
Figure 2:
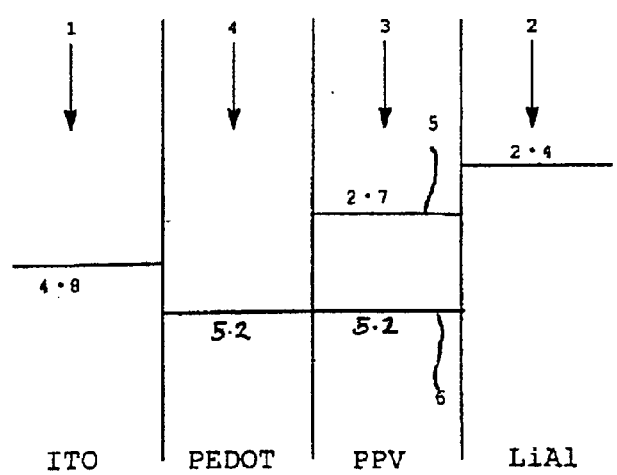
FIG. 2 shows energy levels across the device of FIG. 1.

In the present invention, the compositions of the first, second and third regions may be considered independently because these regions function independently in a device.

In a first aspect of the present invention, the first region comprises a first monomer comprising a substituted or unsubstituted aromatic or heteroaromatic group. The components of the first region are selected so as to select an appropriate first LUMO level. This selection is system specific when the polymer is used in an electroluminescent device. This selection will depend on the work function of the cathode and the LUMO level of the emissive material, which may or may not be the third LUMO level. Preferably, the first LUMO level is an energy level which lies between the work function of the cathode and the LUMO level of the emissive material or which is matched to the LUMO level of the emissive material. To this end, preferably, the first monomer comprises a substituted or unsubstituted fluorene group. This group is especially advantageous when comprised in the first region because the structure of fluorene is such that certain lengthed chains of fluorene monomers, particularly chain lengths over 5, have excellent electron transport properties when used with an appropriate cathode and emitter material (which may or may not be the third region).

In particular, the first monomer comprises a 2,7-linked dialkyl fluorene group. 2,7-linked fluorene groups are preferred. More preferably, the 2,7-linked dialkyl fluorene group is a 9,9 dioctyl fluorene. 9,9 disubstituted, preferably dialkyl or diaryl, fluorene groups are preferred because of their ease of synthesis. The octyl substituent is preferred because this improves the solubility of the polymer.

In a second aspect of the present invention, the second region comprises a second monomer comprising a substituted or unsubstituted aromatic or heteroaromatic group. Preferably, the second monomer comprises a triarylamine unit having the general formula —(Ar₃N)— wherein each Ar is the same or different and comprises a substituted or unsubstituted aromatic or heteroaromatic group. The presence of a triarylamine unit in the second monomer is preferred because the low oxidation potential of triarylamines makes them particularly suitable as positive charge transport materials.

The components of the second region are selected so as to select an appropriate second HOMO level. This selection is system specific when the polymer is used in an electroluminescent device. This selection will depend on the work function of the anode and the HOMO level of the emissive material, which may or may not be the third HOMO level. Preferably, the second HOMO level is an energy level which lies between the work function of the anode and the HOMO level of the emissive material or which is matched to the HOMO level of the emissive material.

It is preferred that at least one Ar comprises a substituted or unsubstituted phenyl group. This is because this has been shown to give rise to good hole transporting in the second region when the polymer is used with an appropriate emitter material, which may or may not be the third region.

It is also preferred that at least one Ar comprises a substituted or unsubstituted aromatic or heteroaromatic side group that is pendent to the polymer backbone. Preferred side groups are those comprising an unsubstituted phenyl or a monosubstituted or 3,5-disubstituted phenyl group. If the side group has a substituent group, preferred substituent groups are substituted or unsubstituted alkyl, perfluoroalkyl, alkylaryl, arylalkyl, heteroaryl, aryl, alkoxy, thioalkyl or cyano groups. These are preferred because they are suitable for helping to select the second HOMO level and/or for improving solubility of the polymer.

Examples of suitable groups comprised in the triarylamine unit are shown in formulas I, II, III, IV, V, and VI below:

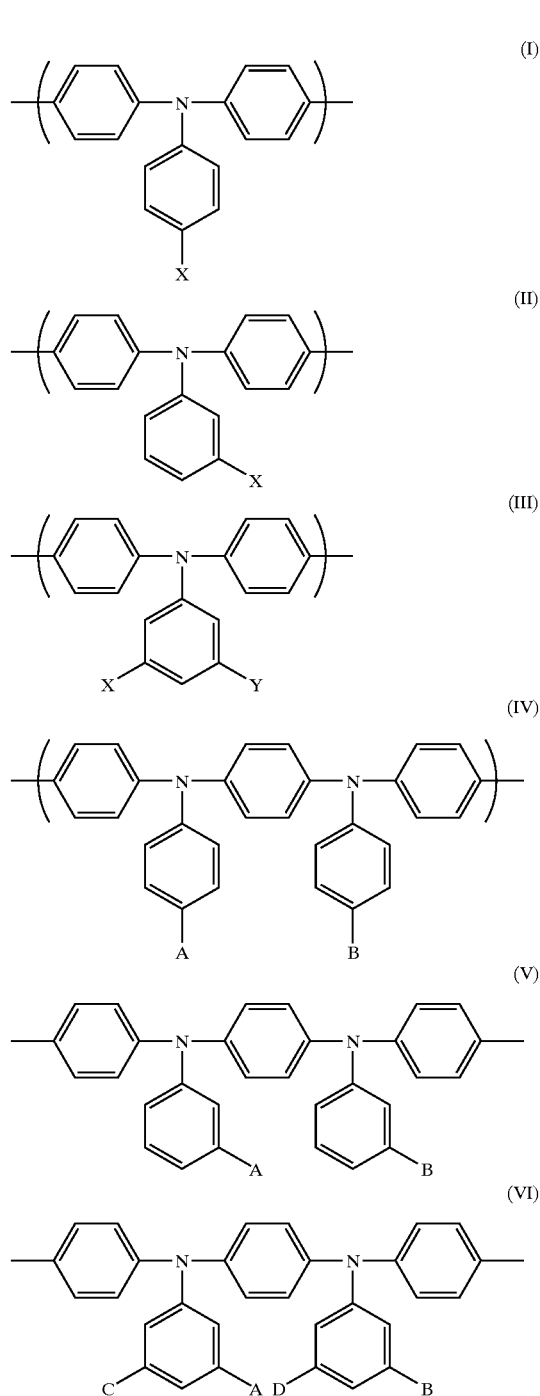

In formulas I, II and III, X and Y may be the same or different and are substituent groups. In formulas IV, V and VI, A, B, C and D may be the same or different and are substituent groups. As set out above, it is preferred that one or more of X, Y, A, B, C and D is independently selected from the group consisting of alkyl, aryl, perfluoroalkyl, thioalkyl, cyano, alkoxy, heteroaryl, alkylaryl and arylalkyl groups. One or more of X, Y, A, B, C and D also may be hydrogen.

It is preferred that one or more of X, Y, A, B, C and D is independently an unsubstituted, isobutyl group, an n-alkyl, an n-alkoxy or a trifluoromethyl group because they are suitable for helping to select the second HOMO level and/or for improving solubility of the polymer.

From a practical view point, it is preferred that X and Y; or A, B, C and D are the same.

In a third aspect according to the present invention, the third region comprises a third monomer comprising a substituted or unsubstituted aromatic or heteroaromatic group.

The three embodiments of the third aspect of the present invention set out below will each result in different wavelength light being emitted from the polymer when used in a device structure. Predominantly, embodiment 1 relates to, but is not restricted to, "red" light emission. For the purposes of the present invention, "red" light may be defined as light with a wavelength in the range 600 nm to 700 nm. Predominantly, embodiment 2 relates to, but is not restricted to, "green" light emission. For the purposes of the present invention, "green" light may be defined as light having a wavelength in the range 500 nm to 600 nm. Predominantly, embodiment 3 relates to, but is not restricted to, "blue" light emission. For the purposes of the present invention "blue" light may be defined as light having a wavelength in the range 400 nm to 500 nm.

In the first embodiment according to the third aspect of the present invention, the third monomer comprises a group H which is an aromatic or heteroaromatic diazine group fused to a benzene or thiophene group.

Specifically, the third monomer according to the first embodiment comprises a group having a formula as shown in formula IX:

  (IX)

wherein $Ar_1$ is a substituted or unsubstituted aromatic or heteroaromatic group.

More preferably, the third monomer according to the first embodiment comprises a group having a formula as shown in formula X:

  (X)

wherein $Ar_2$ is a substituted or unsubstituted aromatic or heteroaromatic group and $Ar_1$, is as defined above in relation to formula IX.

Referring to formula X, it is preferred that $Ar_1$ or $Ar_2$ independently comprises a substituted or unsubstituted, fused or unfused benzene, thiophene, furan, quinoxaline, biphenyl or fluorene group because these groups are suitable for selecting, to some extent, the third LUMO level and the third HOMO level. As mentioned above, the third LUMO level and the third HOMO level define the bandgap of the third region and, thus, the wavelength of emission when electrons and holes are combined in the third region to generate light.

In a more specific example of the first embodiment, the third monomer comprises a group having a formula as shown in formula VIII:

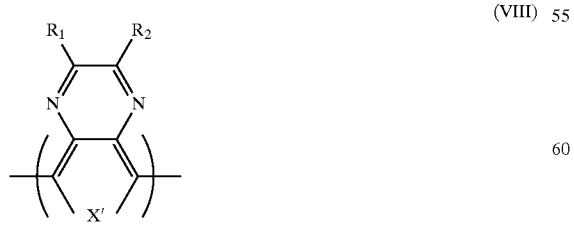  (VIII)

wherein X' is RC=CR or S and $R_1$ and $R_2$ are the same or different and are each a substituent group. Preferably, each R is independently selected from hydrogen, alkyl, aryl, perfluoroalkyl, thioalkyl, cyano, alkoxy, heteroaryl, alkylaryl, or arylalkyl.

In another specific example of the first embodiment, the third monomer comprises a group having a formula as shown in formula XI:

  (XI)

wherein $R_3$ and $R_4$ are the same or different and are each independently a substituent group.

Formulas VIII and XI are preferred because these groups give rise to a third region having desirable third LUMO and third HOMO levels.

Preferably, one or more of $R_1$, $R_2$, $R_3$ and $R_4$ is each independently selected from hydrogen, alkyl, aryl, perfluoroalkyl, thioalkyl, cyano, alkoxy, heteroaryl, alkylaryl, or arylalkyl. These groups are preferred for the same reasons as discussed in relation to X, A, B, C and D above.

Preferably, for practical reasons, $R_1$ and $R_2$ and $R_3$ and $R_4$ are the same. More preferably, they are the same and are each a phenyl group. Even more preferably, $R_1$ and $R_2$ are the same and are each a pyridine or furan group and $R_3$ and $R_4$ are the same and are each hydrogen.

Where $R_3$ and $R_4$ are different, it is preferred that $R_3$ is hydrogen and $R_4$ is an alkyl group.

Specific examples of third monomers according to the first embodiment of the third aspect are shown below in formulas XIII to XXVI:

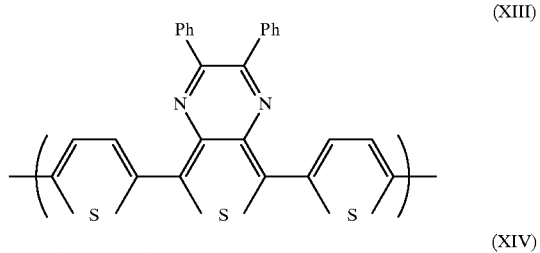  (XIII)

  (XIV)

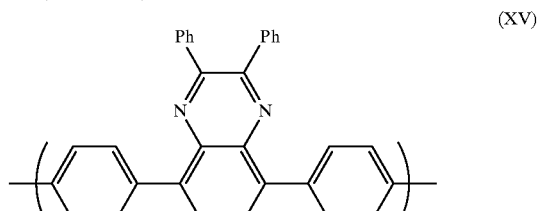  (XV)

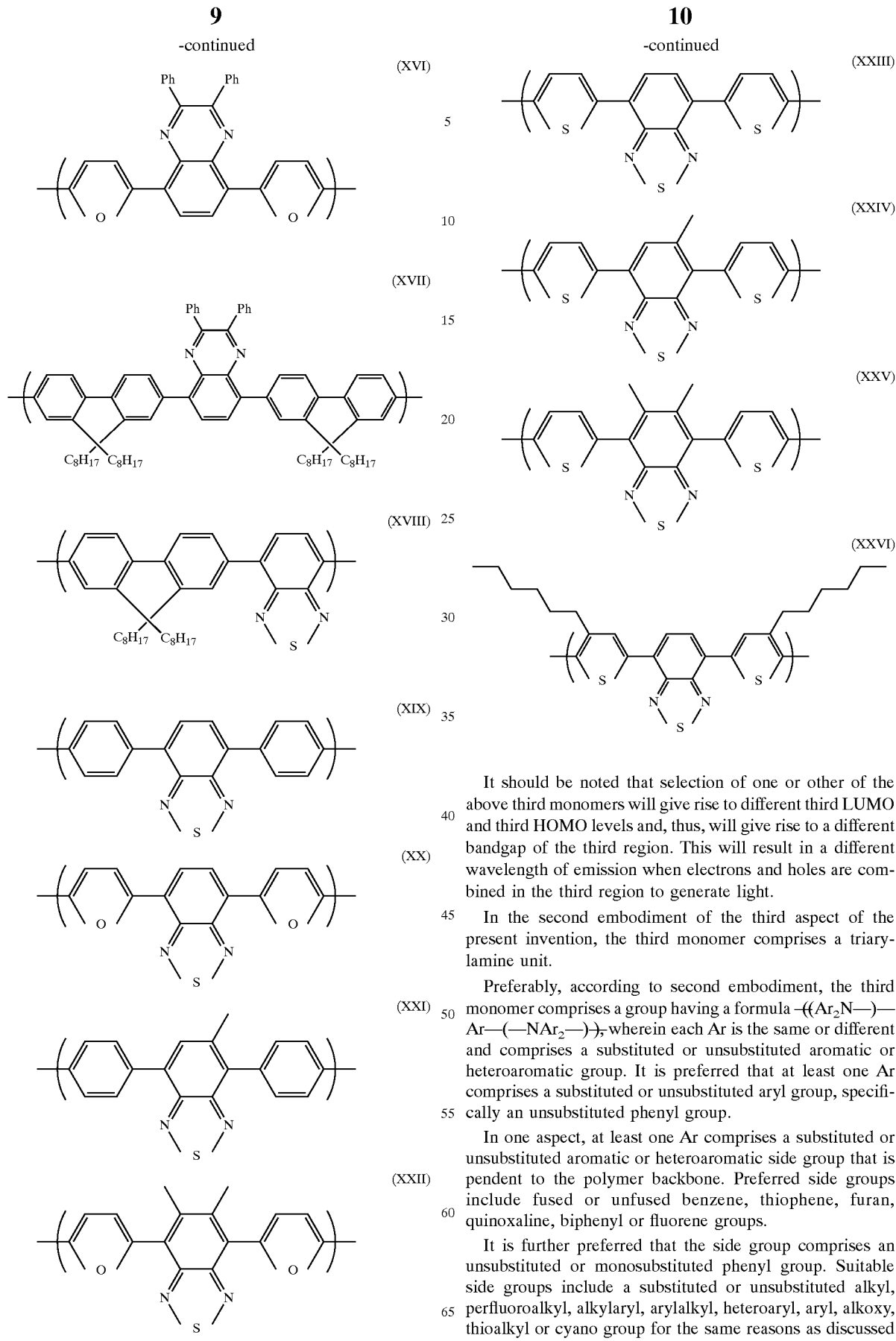

It should be noted that selection of one or other of the above third monomers will give rise to different third LUMO and third HOMO levels and, thus, will give rise to a different bandgap of the third region. This will result in a different wavelength of emission when electrons and holes are combined in the third region to generate light.

In the second embodiment of the third aspect of the present invention, the third monomer comprises a triarylamine unit.

Preferably, according to second embodiment, the third monomer comprises a group having a formula ―((Ar₂N―)―Ar―(―NAr₂―)―), wherein each Ar is the same or different and comprises a substituted or unsubstituted aromatic or heteroaromatic group. It is preferred that at least one Ar comprises a substituted or unsubstituted aryl group, specifically an unsubstituted phenyl group.

In one aspect, at least one Ar comprises a substituted or unsubstituted aromatic or heteroaromatic side group that is pendent to the polymer backbone. Preferred side groups include fused or unfused benzene, thiophene, furan, quinoxaline, biphenyl or fluorene groups.

It is further preferred that the side group comprises an unsubstituted or monosubstituted phenyl group. Suitable side groups include a substituted or unsubstituted alkyl, perfluoroalkyl, alkylaryl, arylalkyl, heteroaryl, aryl, alkoxy, thioalkyl or cyano group for the same reasons as discussed above.

According to the second embodiment of the third aspect, generally, the triarylamine unit may comprise a group having a formula as shown in formula IV wherein A and B are the same or different and are as defined above.

A specific example of formula IV is shown in formula XXVII:

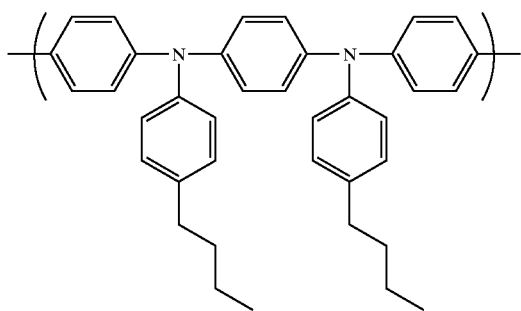

(XXVII)

A third monomer comprising this group is preferred because it gives rise to a third LUMO and third HOMO level and, thus, a bandgap of the third region such that light of a desirable wavelength is emitted when electrons and holes combine in the third region to generate light.

In a further aspect of the present invention, the first region may comprise a fourth monomer comprising a further substituted or unsubstituted aromatic or heteroaromatic group. The fourth monomer has the function of improving negative charge carrier transport. Preferably, the further substituted or unsubstituted aromatic or heteroaromatic group comprises a group having general formula XI wherein $R_3$ and $R_4$ are both hydrogen.

In still a further aspect of the present invention, the second region additionally may comprise a fifth monomer. The fifth monomer may comprise a further second monomer as defined above, which is different from the second monomer. The function of the fifth monomer is to improve positive charge carrier transporting properties of the second region.

Within the broad group of polymers discussed above in relation to the first, second and third aspects of the present invention, four sub-groups of polymers may be defined.

The first of the sub-groups are organic polymers comprising a first region for transporting negative charge carriers and having a first bandgap defined by a first LUMO level and a first HOMO level, a second region for transporting positive charge carriers and having a second bandgap defined by a second LUMO level and a second HOMO level and a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second, and third bandgaps are distinct from one another in the polymer.

A specific example of this sub-group is shown in formula XXVIII:

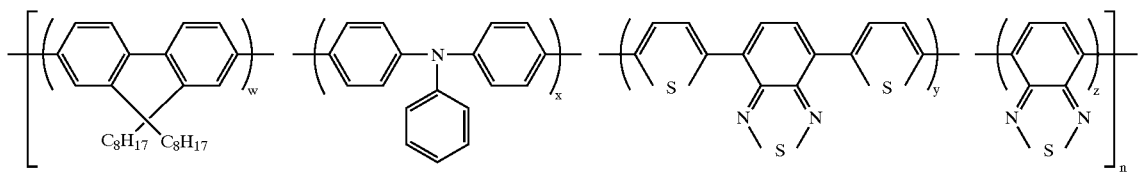

(XXVIII)

wherein w+x+y+z=1, w≧0.5, 0≦x+y+z≦0.5 and n≧2. Preferably, w is approximately 0.5, x is approximately 0.125, y is approximately 0.034 and z is approximately 0.341. Preferably n is ≧5. These values have been shown to give rise to good performance of the polymer when used in an electroluminescent device. This polymer emits "red" light as defined above when used in an electroluminescent device.

Further specific examples of this sub-group are shown in formulas XXIX and XXX:

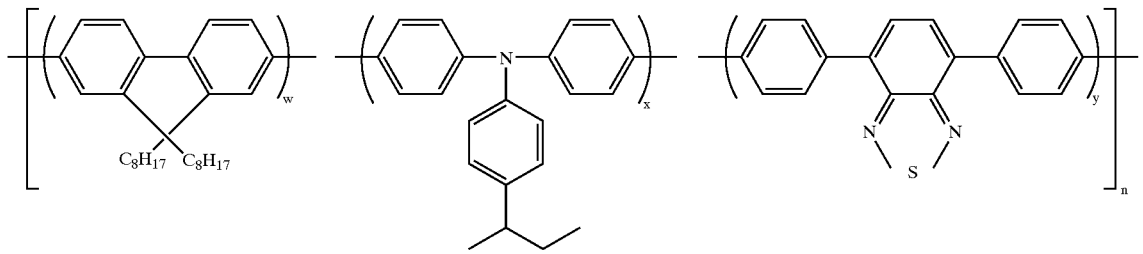

(XXIX)

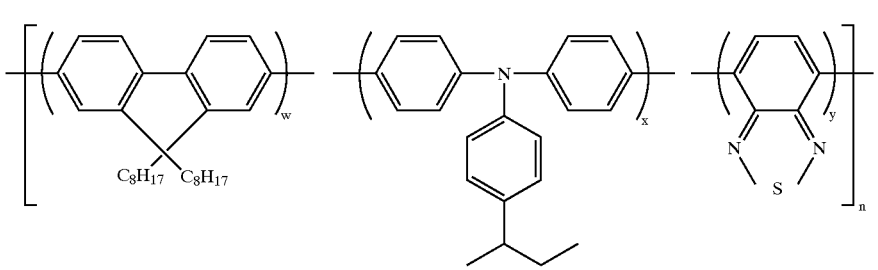

wherein w+x+y=1, w≧0.5, 0≦x+y≦0.5 and n≧2. For formula XXIX, preferably, w is approximately 0.800, x is approximately 0.171 and y is approximately 0.029. Preferably n is ≧5.

For formula XXX, preferably w is approximately 0.864, x is approximately 0.108 and y is approximately 0.028. These values have been shown to give rise to good performance of the polymer, having regard to device efficiency and lifetime, when used in an electroluminescent device. These polymers emit "green" light as defined above when used in an electroluminescent device.

Still further, specific examples of this sub-group are shown in formula XXXI:

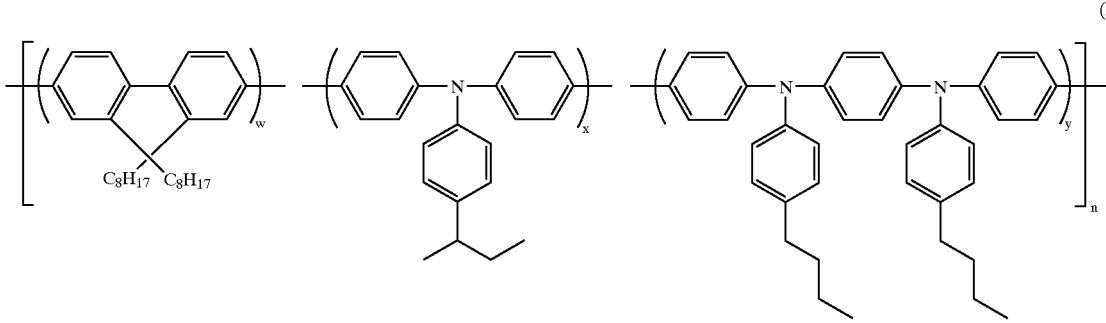

wherein w+x+y=1, w≧0.5, 0≦x+y≦0.5 and n≧2. Preferably, w is approximately 0.80, x is approximately 0.10 and y is approximately 0.10. Preferably n≧5. Also preferably, w is approximately 0.85, x is approximately 0.10 and y is approximately 0.05. These values have been shown to give rise to good performance of the polymer, having regard to device efficiency and lifetime, when used in an electroluminescent device. This polymer emits "blue" light when used in an electroluminescent device.

The second sub-group of polymers according to the present invention are organic polymers comprising a first region for transporting negative charge carriers and having a first bandgap defined by a first LUMO level and a first HOMO level and a second region for transporting positive charge carriers and having a second bandgap defined by a second LUMO level and a second HOMO level and wherein each region comprises one or more monomers and the quantity and arrangement of the monomers within the organic polymer is selected so that the first and second bandgaps are distinct from one another in the polymer.

A specific example of a polymer falling within the second sub-group is shown in formula XXXII or XXXIII:

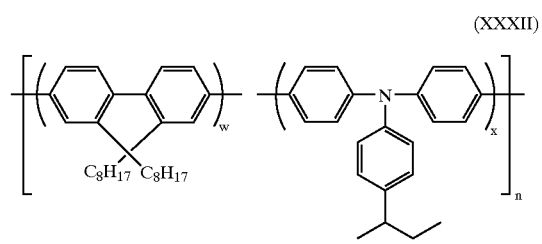

-continued

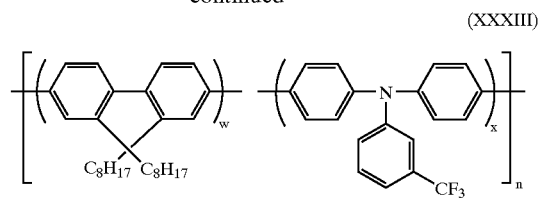

wherein w+x1, w≧0.5, x≦0.5 and n≧2. Preferably, w is approximately 0.90, x is approximately 0.10. Preferably, n≧5. These values have been shown to give rise to good performance of the polymer, having regard to device efficiency and lifetime, when used in an electroluminescent device.

A further example of a polymer falling with the second sub-group is shown in formula XXXIV:

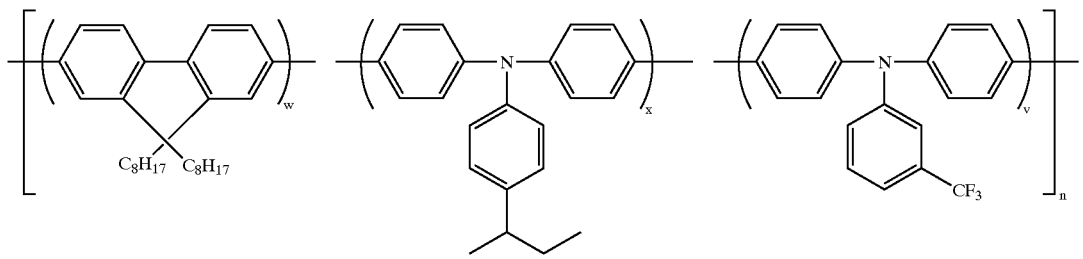
(XXXIV)

wherein w+x+v=1, w≧0.5, 0≦x+v≦0.5 and n≧2. Preferably w is approximately 0.50, x is approximately 0.25 and v is approximately 0.25 or w is approximately 0.90, x is approximately 0.05 and v is approximately 0.05. Preferably n≧5. These values have been shown to give rise to good performance of the polymer, having regard to device efficiency and lifetime, when used in an electroluminescent device.

Still a further example of a polymer falling within the second sub-group is shown in formula XXXV:

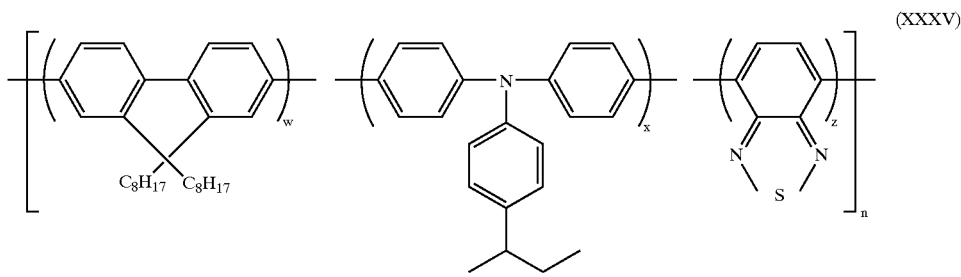
(XXXV)

wherein w+x+z=1, w≧0.5, 0≦x+z≦0.5 and n≧2. Preferably, w is approximately 0.50, x is approximately 0.377, z is approximately 0.123. Preferably, n≧5. These values have been shown to give rise to good performance of the polymer, having regard to device efficiency and lifetime, when used in an electroluminescent device.

A polymer falling within the second sub-group advantageously can be blended with a light emissive material. The blended polymers may form a single layer in a light-emitting device. An example of a suitable light-emissive material is any light-emissive material having suitable HOMO and LUMO levels and, thus, a suitable bandgap.

Polymers falling within the third sub-group of polymers according to the present invention may be defined as organic polymers comprising a first region for transporting negative charge carriers and having a first bandgap defined by a first LUMO level and a first HOMO level and a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first and third bandgaps are distinct from one another in the polymer.

An example of a polymer falling within the third sub-group is shown in formula XXXVI:

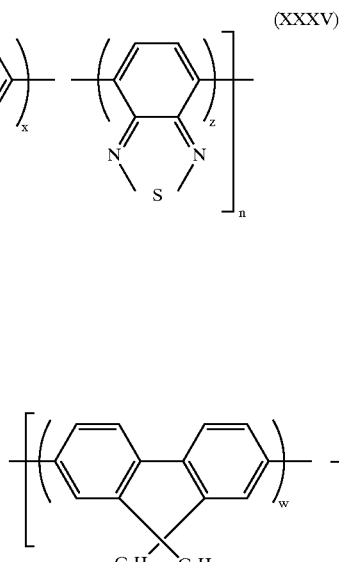
(XXXVI)

wherein w+y=1, w≧0.5, y≦0.5 and n≧2. Preferably, w is approximately 0.964, y is approximately 0.036. Preferably, n≧5. These values have been shown to give rise to good performance of the polymer, having regard to device efficiency and lifetime, when used in an electroluminescent device.

A polymer falling within the third sub-group advantageously may be blended with a hole transporting material when used in a light-emissive device. An example of a suitable hole transporting material is a poly-triarylamine.

A fourth sub-group of polymers according to the present invention may be defined as organic polymers comprising a second region for transporting positive charge carriers and having a second bandgap defined by a second LUMO level and a second HOMO level and a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the second and third bandgaps are distinct from one another in the polymer.

An example of a polymer falling within the fourth sub-group is shown in formula XXXVII:

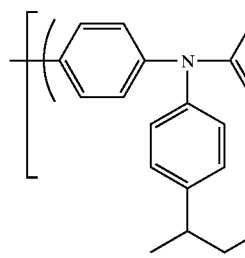 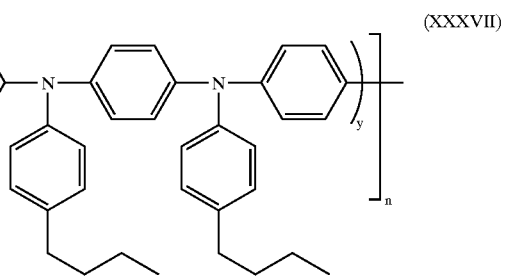

(XXXVII)

wherein x+y=1, x≧0.5, y≦0.5 and n≧2. Preferably, x is approximately 0.5 and y is approximately 0.5. Preferably, n≧5.

A polymer falling within the fourth sub-group advantageously may be blended with an electron transporting material when used in a light emitting device. An example of a suitable electron transporting material is a poly-fluorene such as poly[2,7-(9,9 dialkyl fluorene)], preferably, poly[2,7-(9,9 dioctyl fluorene)].

It should be noted that the first, second and third regions as referred to above, in relation to the first, second, third and fourth sub-groups of polymers according to present invention, are regions as defined in any of the aspects or embodiments of the present invention described above.

Several different polymerisation methods are known which may be used to manufacture polymers in accordance with the present invention.

One particularly suitable method is a process for preparing a conjugated polymer, which comprises polymerising in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a palladium catalyst, and an organic base in an amount sufficient to convert the reactive boron derivative groups into —B(OH)$_3$ anions.

Polymers according to the present invention which have been produced by this method are particularly advantageous. This is because reaction times are short and residual palladium levels are low.

Another polymerisation method is disclosed in U.S. Pat. No. 5,777,070. The process involves contacting monomers having two reactive groups selected from boronic acid, C1—C6 boronic acid ester, C1—C6 borane and combinations thereof with aromatic dihalide functional monomers or monomers having one reactive boronic acid, boronic acid ester or borane group and one reactive halide functional group with each other.

A further polymerisation method is known from "Macromolecules", 31, 1099–1103 (1998). The polymerisation reaction involves nickel-mediated coupling of dibromide monomers. This method commonly is known as "Yamamoto Polymerisation".

In the above-referenced polymerisation methods, a "monomer" may, in one embodiment, be taken to comprise one of the first, second or third regions. In other words, a plurality of monomers, each comprising a first, second or third region and having two reactive groups may be prepared in one or more first reaction steps. The pre-prepared monomers then may be contacted with other pre-prepared monomers in a polymerisation step. In practice, the one or more first reaction steps and the polymerisation step would be carried out in separate reaction vessels.

Polymers according to the present invention typically have a degree of polymerisation of greater than 2, preferably greater than 5.

Typically, a polymer according to the present invention will be introduced into an electroluminescent device as a layer. Such a layer will be located between the anode and the cathode.

In the case of a polymer falling within the first sub-group as defined above, further layers between the anode and the cathode in addition to the layer of the polymer falling with the first sub-group are not necessary. However, it may be advantageous to include further layers such as hole transporting or electron transporting layers.

A polymer falling within the second sub-group defined above may advantageously be blended with a light-emissive material, preferably a light-emissive polymer. A layer of the blend may be included between an anode and a cathode in an electroluminescent device.

A polymer falling within the third sub-group defined above may advantageously be blended with a hole transporting material, preferably a hole transporting polymer. A layer of the blend may be included between an anode and a cathode in an electroluminescent device.

A polymer falling with the fourth sub-group defined above advantageously may be blended with an electron transporting material, preferably an electron transporting polymer when used in an electroluminescent device. A layer of the blend may be included between an anode and a cathode in the electroluminescent device.

In the case of the second, third and fourth sub-groups, further polymer layers also may be introduced between the anode and the cathode if this is desirable in order to optimise electron transport and/or hole transport in the device, and/or emission of light from the device.

EXAMPLES

Example 1

Synthesis of 2,7-dibromo-9,9-dioctylfluorene

Fluorene (166.2 g, 1.0 mol), iodine (0.4 g) and dichloromethane (1 l) are placed in a 5 l, 3-necked round bottomed flask equipped with a magnetic stirrer, dropping funnel and spirit thermometer. To this is added a sodium carbonate solution (280 g in 2-l water) and the reaction mixture cooled to below 5° C. using an ice/salt bath. The bromine solution (120 ml, 2.34 mol in 250-ml dichloromethane) is added dropwise to the reaction mixture maintaining the temperature below 5° C. Once the addition is complete the ice bath is removed and the reaction mixture is allowed to warm with stirring to room temperature. After 18 hours of stirring, the product precipitates out as a fine white powder. The product is filtered off and washed with 1×120 ml of a 20% aqueous solution of sodium thiosulphate and then with 3×350 ml distilled/de-ionised water. The product is dried on the rotary evaporator giving a pure white powder, dibromofluorene, 321 g, 99 %.

Dibromofluorene (320 g) prepared previously (as described above) is added to a KOH solution (1-l, 50% w/w) and Aliquat-336 (3 ml) at 85° C. in a 3 l three-necked round bottomed flask equipped with a magnetic stirrer, reflux condenser and dropping funnel. The suspension was heated to 85° C. at which temperature n-octylbromide (500 ml) is added dropwise, to form eventually a two-phase system. Once the addition is complete the reaction is stirred at 85° C. overnight, and then allowed to cool to room temperature. Dichloromethane is then added to the reaction mixture (500 ml).

The reaction mixture is transferred to a 2 l separating funnel. The organic layer is removed and the aqueous layer washed with 3×200 ml dichloromethane, the combined organic phases are washed with 3×200 ml distilled water. The organic phase was dried over anhydrous magnesium sulphate, filtered and the solvent removed on the rotary evaporator to give a dark oil, which is then ice-cooled and "scratched" giving a yellow/orange solid. The reaction mixture is left in the fridge for at least an hour before the solid is filtered off and dried on a vacuum pump.

The product is dissolved in hexane (~1.5 l) and passed down a glass column under pressure of nitrogen (column diameter ~60 mm) packed with sand (1 cm), silica gel 70–230 mesh, (60 cm), 1 cm sand. Please note that the column should be washed with 1.5 l hexane before and after the product is eluted down it. The eluent is evaporated and cooled to produce a white solid, which is then recrystallised from hexane.

Recrystallisation is carried out in the minimum volume of hexane required. The product, 2,7-dibromo-9,9-dioctylfluorene (i), is obtained as a colourless crystalline (white) solid, The crystalline product is dried at room temperature under vacuum too constant mass, and analysed for purity by HPLC. The final yield of 2,7-dibromo-9,9-dioctylfluorene is 347 g, 64%.

Example 2

Synthesis of 2,7-bis(1,3,2-dioxaborolan-2-yl)-9,9-dioctylfluorene

In a 2 L three-neck flask equipped with magnetic stirrer, nitrogen inlet, rubber septum and low temperature thermometer is dissolved 2,7-dibromo-9,9-dioctylfluorene (200 g, 0.365 mol.) in 1 l of dry THF. With the aid of a dry ice/acetone bath the solution is cooled to ~−78° C. during which time the dibromide precipitates. Butyllithium (320 ml of 2.5 M solution in hexane, 1.1 equivalents per bromide) was added fairly quickly maintaining the temperature below ~−50° C. At half addition the bromide has all dissolved and around three quarters addition 2,7-dilithio-9,9-dioctylfluorene starts to precipitate. After complete addition the slurry of the dilithiofluorene is stirred for a further half an hour. Fresh trimethylsilyl chloride (TMSCl) (120 ml,) is added quickly while maintaining the temperature below −30° C. The cooling bath is removed and the solution allowed to warm to room temperature, (usually overnight). TLC analysis (hexane eluent) shows a single spot close to the solvent front. The solution is filtered into a single-neck flask and the solvents are removed by rotary evaporation. Hexane is added to the residue and the resulting solution is filtered to remove the LiCl, washing thoroughly with more hexane. The hexane is removed and the remaining oil subject to high vacuum to remove all traces of THF and hexane. The yield of 2,7-di(trimethylsilyl)-9,9-dioctylfluorene is quantitative.

The di-TMS (trimethylsilyl) derivative is transferred to a fresh 2 L three-neck flask (equipped with nitrogen inlet, rubber septum and thermometer) with 500 ml dry dichloromethane and the solution cooled under nitrogen to ~−78° C. during which time it crystallises. Boron tribromide (120 ml, ~1.5 equivalents per TMS group) is added over five minutes. The appearance of a green colour (which varies in intensity) accompanies the addition of the first one or two millilitres. After complete addition the mixture is allowed to warm to room temperature and is typically stirred overnight. However the reaction is probably complete in two hours.

The room temperature solution is then added dropwise to a solution of KOH (600 g) in water (1.5 l). A thick white precipitate of the di-potassium di-boronate salt is produced.

Stirring is continued for ten minutes to ensure that all the acid has reacted. The two phase mixture is filtered in a large glass sinter funnel, sucked to partial dryness and then washed with plenty of water. The solid is then added gradually to a rapidly stirred mixture of 5 M HCl (1.2 l) and ether (1.2 l) contained in a 5 l conical flask. After about half an hour the regenerated diacid is contained in the ether layer, which is separated and washed with 500 ml de-ionised water.

This process is then repeated, i.e. the ether solution is then added dropwise to a solution of KOH (600 g) in water (1.5 l). A thick white precipitate of the di-potassium di-boronate salt is produced. Stirring is continued for ten minutes to ensure that all the acid has reacted.

The two phase mixture is filtered in a large glass sinter funnel, sucked to partial dryness and then washed with plenty of water. The solid is then added gradually to a rapidly stirred mixture of 5 M HCl (1.2 l) and ether (1.2 l) contained in a 5 l conical flask. After about half an hour the regenerated diacid is contained in the ether layer, which is separated and washed with 500 ml de-ionised water.

The ether is removed and the product dissolved in ca 1–1.5 l toluene and ethylene glycol, (40 g, 0.645 mol.), is added. The mixture is heated overnight and the water produced removed on a Dean-Stark trap (17 ml collected). The toluene is removed to yield an oil. To which is added acetonitrile (ca. 1 l); the mixture is heated to reflux to dissolve the oil, and then left to cool to room temperature. Cooling is continued in the fridge. The crystals are filtered and washed with plenty of acetonitrile and dried. The dry crystals are then dissolved in hexane, (ca. 1 l), which is then allowed to cool to room temp. and left in the fridge overnight. The target compound, 2,7-bis(1,3,2-dioxaborolan-2-yl)-9,9-dioctylfluorene, is obtained as a colourless solid (110 g, 57%*).

Example 3

Synthesis of bis(4-bromophenyl)-4-sec-butylphenylamine

In a 2 l round bottomed flask fitted with a mechanical overhead stirrer, glass stirring shaft Teflon stirring blade, condenser was placed 4-sec-butylaniline (200 g, 1.34 mol., often freshly distilled under vacuum prior to use). This compound was then dissolved in a mixture of concentrated hydrochloric acid (350 ml) and 350 ml of water. A thermometer was placed in the solution and the flask was immersed in a acetone/dry ice bath. The reaction mixture was stirred and cooled to below 5° C. A chilled solution of sodium nitrite (100 g, 1.449 mol. in 250 ml of water) was added slowly (3–5 ml batches using a syringe) to the reaction mixture. The temperature was not allowed to rise above 10° C.

A solution of potassium iodide (228 g, 1.73 mol. in 250 ml water) was added slowly (5–10 ml aliquots). The reaction mixture was allowed to stir at room temperature for 2–3 hours. The reaction vessel was then fitted with an air condenser and the reaction mixture was heated cautiously (oil bath temp ~100° C. max) until evolution of gas (nitrogen) ceases. The mixture was allowed to cool to room temperature. The organic phase was separated from the aqueous. The aqueous phase was washed with dichloromethane (4×500 ml). The organic phase and dichloromethane extracts were combined and washed with an excess of a solution of sodium metabisulphite. The organic phase was dried with magnesium sulphate, filtered and stripped of solvent using a reduced pressure rotary evaporator. The crude oil was then distilled under vacuum, to afford a colourless liquid, 4-sec-butyl-1-iodobenzene, (245 g, 70%).

A 3 l reaction vessel fitted with mechanical stirrer, condenser, nitrogen inlet and outlet was charged with the following reagents, 4-sec-butyl-1-iodobenzene (240 g 0.916 mole), diphenylamine (153.2 g, 1.58 mole), sodium-tert-butoxide (273.2 g, 2.84 mole), palladium acetate (3.81 g, 0.0170 mol.), tri-o-tolylphosphine (10.32 g, 0.034 mol.) and toluene 21. The reaction mixture was stirred at room temperature and the vessel was purged with nitrogen for 20 minutes. The reaction mixture was heated to and maintained at reflux with stirring under nitrogen for 24 hours (oil bath temp 140° C.).

The reaction mixture was allowed to cool and quenched with 2 M hydrochloric acid 1l. The organic phase was separated from the aqueous and passed through a bed of cellite. The solution was then concentrated and passed, (under pressure of nitrogen), down a glass column packed (6 cm diameter by ~70 cm long) with silica gel 70–230 mesh using hexane as the eluting solvent. The eluent was striped of solvent to afford an oil, which crystallised to a white solid upon the addition of a small quantity of methanol. The solid was then recrystallised from isopropanol to yield white crystals of N,N-diphenyl-4-sec-butylphenylamine (101 g, 37%).

In a 1 l three necked flask fitted with magnetic stirrer bar, pressure equalised dropping funnel and nitrogen inlet/outlet was placed N,N-diphenyl-4-sec-butylphenylamine (29 g 0.096 mole, 100 % pure by HPLC) and anhydrous DMF 350 ml. N-bromosuccinimide (34.18 g 0.182 mole) dissolved in cold anhydrous DMF (100 ml) was added dropwise to the reaction mixture with rapid stirring at −10 to 0° C. over ~20 minutes.

The mixture was allowed to warm to room temperature, and was then added dropwise to 2 l of ethanol/water 3:1 with rapid stirring. The white precipitated solid was filtered and recrystallised from isopropanol to give bis(4-bromophenyl)-4-sec-butylphenylamine, as a white solid (23.5 g, 53%).

Example 4

Synthesis of 4,7-dibromo-2,1,3-benzothiadiazole

A suspension of 2,1,3-benzothiadiazole (100 g, 0.74 mol) in hydrobromic acid (48% aq.) (500 mL) was heated to 100° C. After 30 mins, bromine (120 mL, 4.68 mol) was added dropwise and the suspension stirred at 100° C. for a further 24 h. The reaction was quenched by pouring the crude mixture onto vigorously stirred ice/water. Stirring was maintained for 30 mins after which, the residue was washed with sodium thiosulphate (2×400 mL, 20% solution) and was then dissolved in toluene (1.5 L). The solution was treated twice with charcoal (1 g) and heated for 2 h at 100° C. After removal of the charcoal the solution was concentrated until a solid began to appear. Methanol was added to the mixture and left to recrystallise, affording 105 g, 49%.

Example 5

Synthesis of polymer according to formular XXXII (where the degree of polymerisation is ~10).

A 2 l recation vessel fitted with a glass stirring rod attached to an electrical mechanical stirrer, teflon stirring blade, reflux condenser (connected to a nitrogen line) was charged with 2,7-bis(1,3,2-dioxaborolan-2-yl)-9,9-dioctylfluorene (50.5610 g, 95.33 mmol.), 2,7-dibomo-9,9-dioctylfluorene (41.7812 g, 76.18 mmol), bis(4-bromophenyl)-4-sec-butylphenylamine (8.7560 g 19.08 mmol), tetrakistriphenylphosphine palladium 300 mg, and toluene 950 ml. The mixture was stirred at room temperature for ten minutes.

Tetraethylammonium hydroxide (320, 20% w/v) is then added to the mixture which is then allowed to stir at room temperature under flow of nitrogen for 20 minutes.

The reaction mixture was heated to and maintained at reflux for up to 18 hours (typically left overnight). During this time the reaction mixture was stirred (setting rate 2–3) under an atmosphere of nitrogen.

Bromobenzene (10 ml) was added and the reaction mixture was allowed to stir at reflux for a further 2 hours, after which phenyl boronic acid was added (11 g) and the reaction mixture was allowed to stir at temperature for a further 2 hours.

The mixture was allowed to cool to room temperature and poured into 4 L of methanol to precipitate the polymer. The polymer/methanol mixture was then filtered. The polymer isolated by filtration was then further repreciptated into methanol from toluene solution, and dried under vacuum yield ~55.

The polymer obtained by this method had a peak molecular weight of 180,000. The molecular weight was measured using a Polymer Labs GPC system incorporating an LC1120 isocratic pump and ERC-7515A Refractive Index Detector. The solvent used was THF at a flow rate of 1 mL/min, and the temperature was controlled at 35° C. The column type was PL mixed (*2, 30 cm) calibrated using PL 600–500,000 polystyrene standards.

Example 6

Synthesis of a Blend of a Polymer Having Formula XXXII with a Light-emissive Material Polymer with structure XXXII (60 g) and polymer with structure XXXVI, w=y, (2.37 g) are placed in a 5 l round bottomed flask fitted with a magnetic stirrer bar, reflux condenser which is connected to a flow of nitrogen. The polymer mixture is then dissolved in ~3.5 l of toluene at ~65° C. with stirring under nitrogen. When dissolution is complete the polymer solution is allowed to cool to room temperature. The viscous solution is then added dropwise to a large excess of rapidly stirring methanol (4×4 l). The precipitated polymer is then filtered. The polymer is then dried to constant weight under vacuum. The final yield should be quantitative i.e. 62.37 g.

What is claimed is:

1. An organic polymer having a plurality of regions along the length of the polymer backbone and comprising two or more of the following:

(i) a first region for transporting negative charge carriers and having a first bandgap defined by a first LUMO level and a first HOMO level; and (ii) a second region for transporting positive charge carriers and having a second bandgap defined by a second LUMO level and a second HOMO level; and (iii) a third region for accepting and combing positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer, wherein the polymer is a block polymer and the regions are blocks and wherein there is no cross-linking functionality on the polymer.

2. An organic polymer according to claim 1, wherein the first region comprises a first monomer comprising a substituted or unsubstituted aromatic or heteroaromatic group.

3. An organic polymer according to claim 2, wherein the first monomer comprises a substituted or unsubstituted fluorene group.

4. An organic polymer according to claim 3, wherein the first monomer comprises a 2,7-linked dialkyl fluorene group.

5. An organic polymer according to claim 4, wherein the 2,7-linked dialkyl fluorene group is a 9,9 dioctyl fluorene group.

6. An organic polymer according to claim 1, wherein the second region comprises a second monomer comprising a substituted or unsubstituted aromatic or heteroaromatic group.

7. An organic polymer according to claim 6, wherein the second monomer comprises a triarylamine unit having the general formula —[(Ar)$_3$N]— wherein each Ar is the same or different and comprises a substituted or unsubstituted aromatic or heteroaromatic group.

8. An organic polymer according to claim 7, wherein at least one Ar comprises a substituted or unsubstituted phenyl group.

9. An organic polymer according to claim 7, wherein at least one Ar comprises a substituted or unsubstituted aromatic or heteroaromatic side group that is pendent to the polymer backbone.

10. An organic polymer according to claim 9, wherein the side group comprises a substituted or unsubstituted aryl group.

11. An organic polymer according to claim 10, wherein the side group comprises an unsubstituted phenyl or a monosubstituted or 3,5-disubstituted phenyl group.

12. An organic polymer according to claim 9, wherein the side group has a substituent group comprising a substituted or unsubstituted alkyl, perfluoroalkyl, alkylaryl, arylalkyl, heteroaryl, aryl, alkoxy, thioalkyl or cyano group.

13. An organic polymer according to claim 6, wherein the second monomer comprises a triarylamine unit having a formula as shown in any one of Formulas I, II, of III, IV, V, or VI:

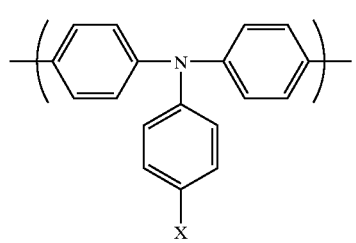
(I)

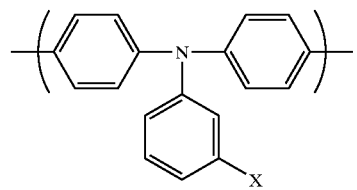
(II)

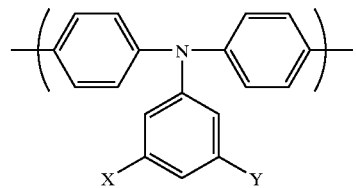
(III)

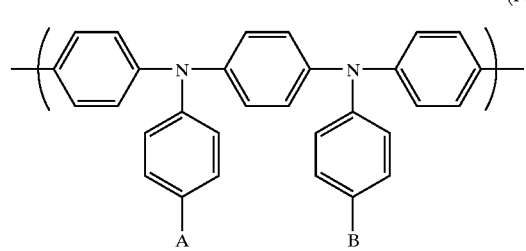
(IV)

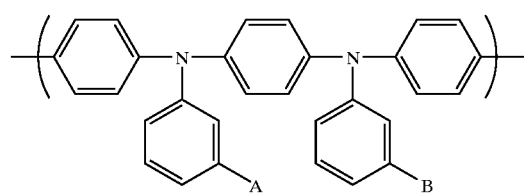
(V)

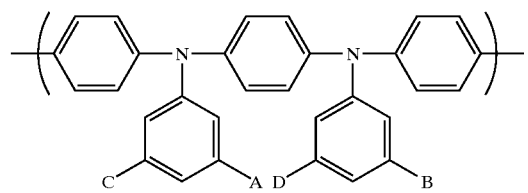
(VI)

where X, Y, A, B, C, and D are the same or different and are substituent groups.

14. An organic polymer according to claim 13, wherein one or more of X, Y, A, B, C and D is independently selected from the group consisting of hydrogen, alkyl, cyano, alkoxy, heteroaryl, alkylaryl, and arylalkyl groups.

15. An organic polymer according to claim 14, wherein one or more of X, Y, A, B, C and D is independently selected from the group consisting of an unsubstituted, isobutyl group, an n-alkyl, an n-alkoxy or a trifluoromethyl group.

16. An organic polymer according to claim 14, wherein X and Y or A, B, C and D are the same.

17. An organic polymer according to claim 1, wherein the third region comprises a third monomer comprising a substituted or unsubstituted aromatic or heteroaromatic group.

18. An organic polymer according to claim 17, wherein the third monomer comprises a group H which is an aromatic or heteroaromatic diazine group fused to a benzene or thiophene group.

19. An organic polymer according to claim 18, wherein the third monomer comprises a group having a formula as shown in Formula IX or X:

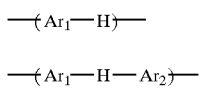 (IX)

—(Ar₁—H—Ar₂)— (X)

wherein Ar₁, and Ar₂ are independently is a substituted or unsubstituted aromatic or heteroaromatic group.

20. An organic polymer according to claim 19, wherein Ar₁ or Ar₂ independently comprises a substituted or unsubstituted, fused or unfused benzene, thiophene, furan, quinoxaline, biphenyl or fluorene group.

21. An organic polymer according to claim 18 wherein the third monomer comprises a group having a formula as shown in Formula VIII or XI:

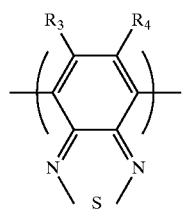 (XI)

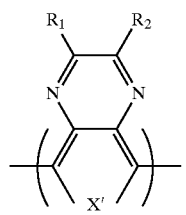 (VIII)

wherein X' is RC=CR or S and R₁ and R₂ or R₃ and R₄ are the same or different and are each a substituent group.

22. An organic polymer according to claim 21, wherein one or more of R₁, R₂, R₃ and R₄ is each independently selected from hydrogen, alkyl, aryl, perfluoroalkyl, thioalkyl, cyano, alkoxy, heteroaryl, alkylaryl, arylalkyl, pyridine or furan.

23. An organic polymer according to claim 22, wherein R₁ and R₂ or R₃ and R₄ are the same and are each a phenyl group.

24. An organic polymer according to claim 18, wherein the third monomer comprises a group having a formula as shown in any one of Formulas XIII to XVII:

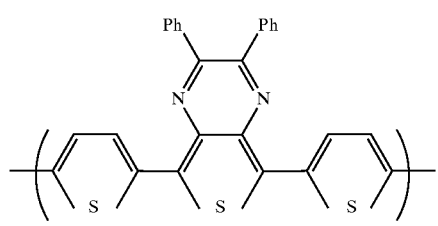 (XIII)

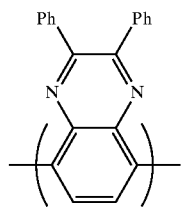 (XIV)

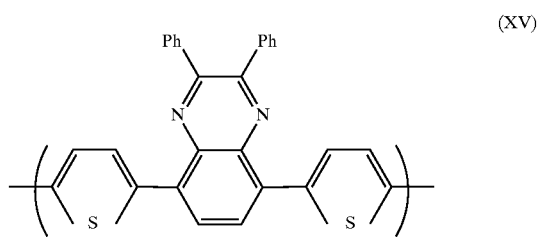 (XV)

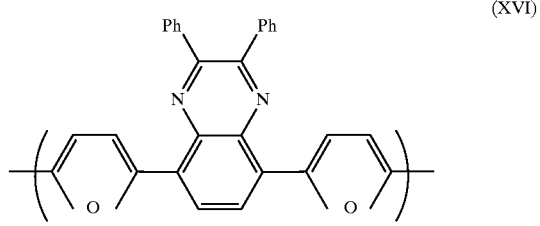 (XVI)

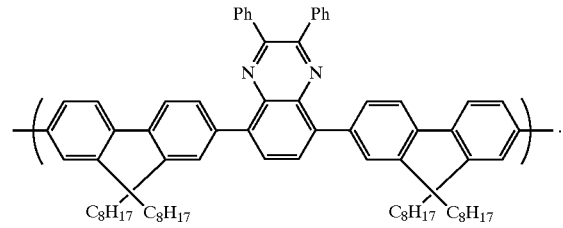 (XVII)

25. An organic polymer according to claim 18, wherein the third monomer comprises a group having a formula as shown in any one of Formulas XVIII to XXVI:

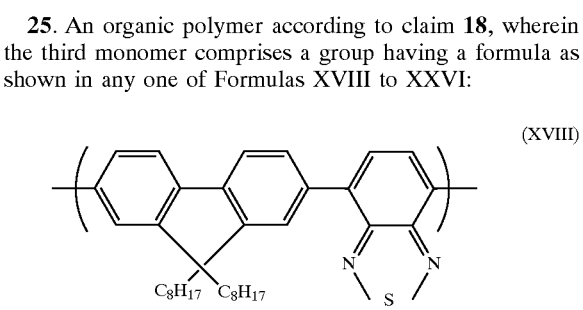 (XVIII)

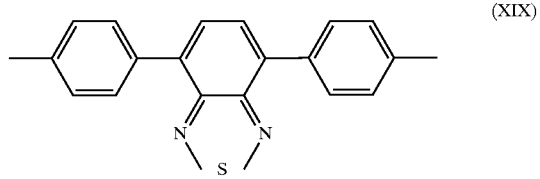 (XIX)

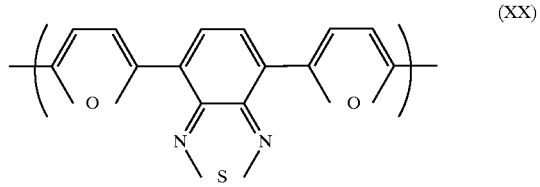 (XX)

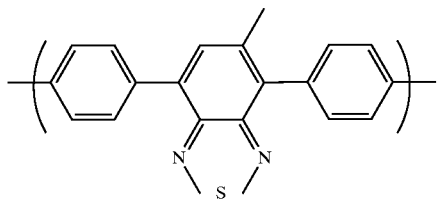 (XXI)

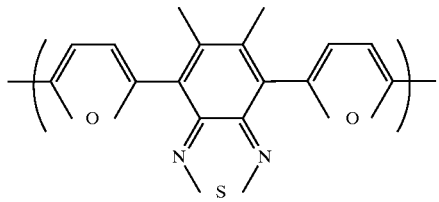 (XXII)

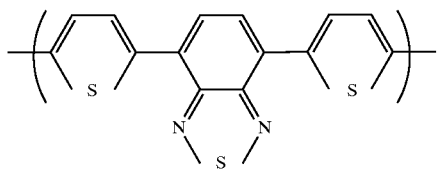 (XXIII)

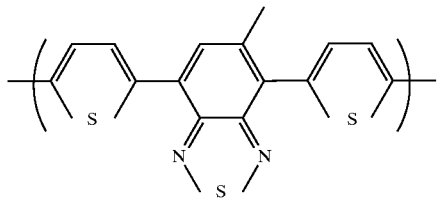 (XXIV)

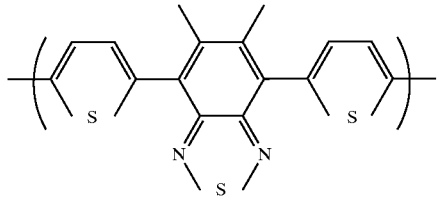 (XXV)

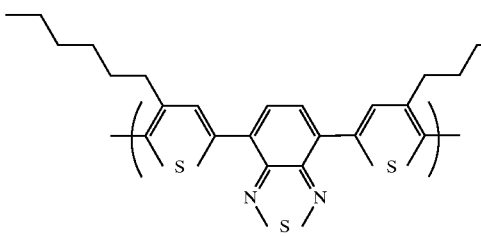 (XXVI)

26. An organic polymer according to claim 17, wherein the third monomer comprises a triarylamine unit.

27. An organic polymer according to claim 26, wherein third monomer comprises a group having the formula —[(—(Ar)$_2$(N)—)—Ar—(—N(Ar)$_2$)]—, wherein each Ar is the same or different and comprises a substituted or unsubstituted aromatic or heteroaromatic group.

28. An organic polymer according to claim 27, wherein at least one Ar comprises a substituted or unsubstituted aryl group.

29. An organic polymer according to claim 28, wherein the at least one Ar comprises an unsubstituted phenyl group.

30. An organic polymer according to claim 27, wherein at least one Ar comprises a substituted or unsubstituted aromatic or heteroaromatic side group that is pendent to the polymer backbone.

31. An organic polymer according to claim 30, wherein the side group comprises fused or unfused benzene, thiophene, furan, quinoxaline, biphenyl or fluorene group.

32. An organic polymer according to claim 31, wherein the side group comprises a monosubstituted phenyl group.

33. An organic polymer according to claim 30, wherein the side group has a substituent group comprising hydrogen or a substituted or unsubstituted alkyl, perfluoroalkyl, alkylaryl, arylalkyl, heteroaryl, aryl, alkoxy, thioalkyl or cyano group.

34. An organic polymer according to claim 32, wherein the triarylamine unit comprises a group having a formula as shown in Formula IV

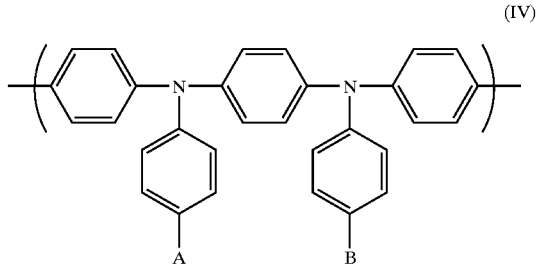 (IV)

wherein A and B are the same or different and are substituent groups.

35. An organic polymer according to claims 34, wherein the third monomer comprises a group having a formula as shown in Formula XXVII:

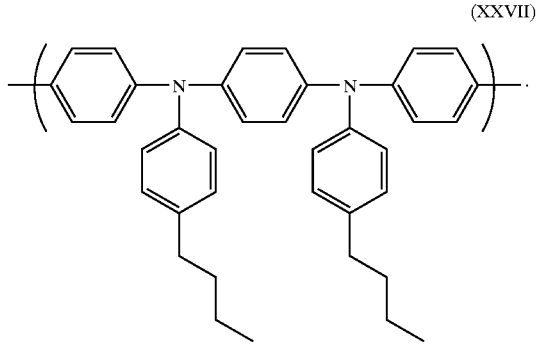 (XXVII)

36. An organic polymer according to claim 1, wherein the first region additionally comprises a fourth monomer comprising a further substituted or unsubstituted aromatic or heteroaromatic group.

37. An organic polymer according to claim 36, wherein the further substituted or unsubstituted aromatic or heteroaromatic group comprises a group as shown in formula XI

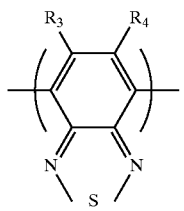

(XI)

wherein $R_3$ and $R_4$ are both hydrogen.

38. An organic polymer according to claim 6, wherein the second region additionally comprises a fifth monomer, which is different from the second monomer.

39. An organic polymer having a plurality of regions along the length of the polymer backbone and comprising all three of the following:
(i) a first region for transporting negative charge carriers and having a first bandgap defined by a first LUMO level and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer wherein the polymer is a block copolymer and each region is a block.

40. An organic polymer according to claim 39, wherein the third region is in a layer between the anode and the cathode and when a voltage is applied emits light with a wavelength in the range 600 nm to 700 nm.

41. An organic polymer according to claim 39, having a formula as shown in Formula XXVIII:

XXVIII

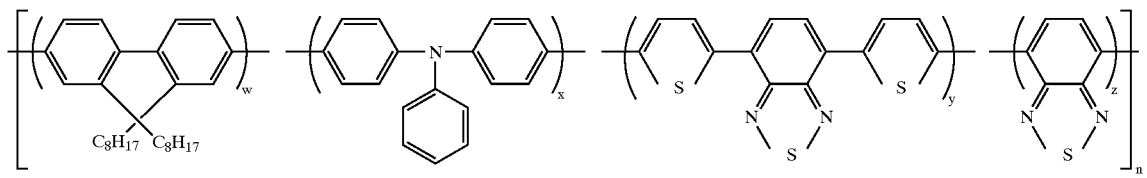

wherein $w+x+y+z-1$, $w \geq 0.5$, $0<(x+y+z) \leq 0.5$ and $n \geq 2$.

42. An organic polymer according to claim 39, wherein the third light having a wavelength in the range 500 nm to 600 nm.

43. An organic polymer according to claim 39, having a formula as shown in Formula XXIX:

(XXIX)

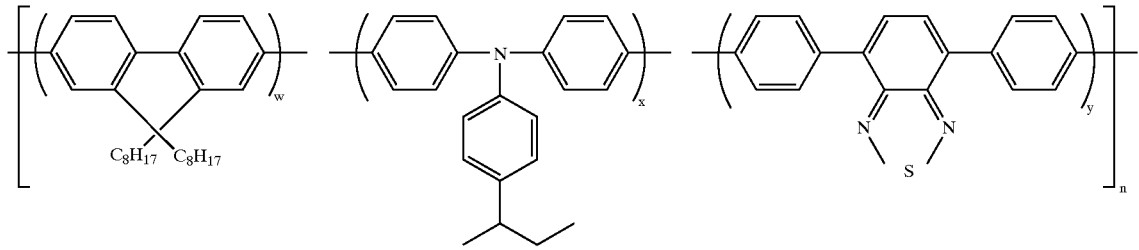

wherein $w+x+y=1$, $w \geq 0.5$, $0<(x+y) \leq 0.5$ and $n \geq 9$.

44. An organic polymer according to claim 39, having a formula as shown in Formula XXX:

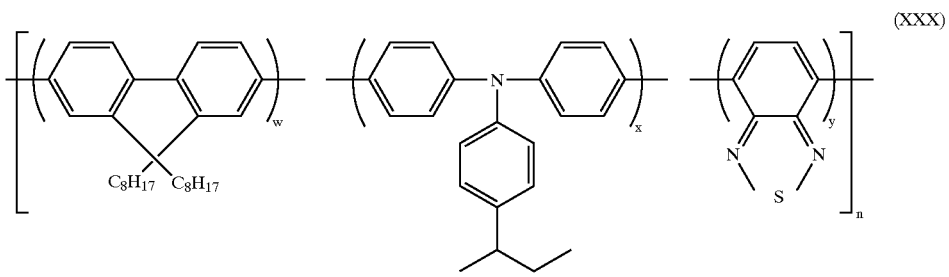
(XXX)

wherein w+x+y=1, w≧0.5, 0<(x+y)≦0.5 and n≧2.

45. An organic polymer according to claim 39, wherein the third monomer is in a layer between the anode and the cathode and when a voltage is applied emits light having a wavelength in the range of 400 nm to 500 nm.

46. An organic polymer according to claim 1, having a formula as shown in Formula XXXI:

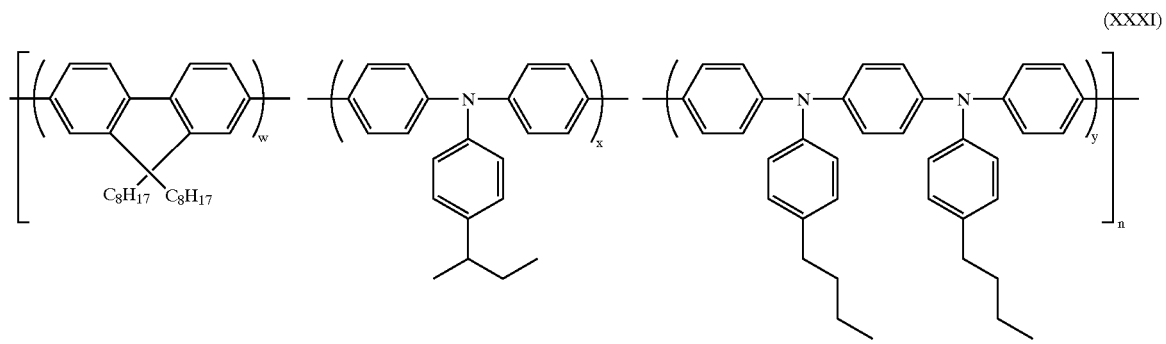
(XXXI)

wherein w+x+y=1, w≧0.5, 0<(x+y)≦0.5 and n≧9.

47. An organic polymer according to claim 1, comprising:
(i) a first region for transporting negative charge carriers and having a first bandgap defined by a first LUMO level and a first HOMO level; and
(ii) a second region for transporting positive charge carriers and having a second bandgap defined by a second LUMO level and a second HOMO level;

and wherein each region comprises one or more monomers and the quantity and arrangement of the monomers within the organic polymer is selected so that the first and second bandgaps are distinct from one another in the polymer.

48. An organic polymer according to claim 47, having a formula as shown in Formula XXXII or XXIII:

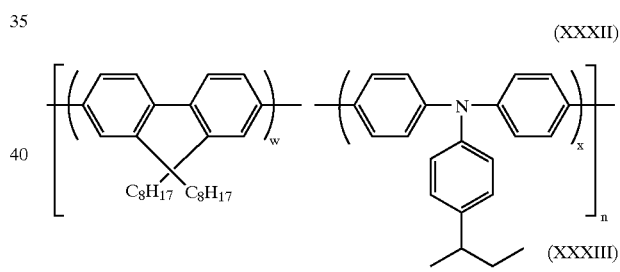
(XXXII)

(XXXIII)

wherein w+x=1, w≧0.5, 0≦x≦0.5 and n≧2.

49. An organic polymer according to claim 47, having a formula as shown in Formula XXXIV:

(XXXIV)

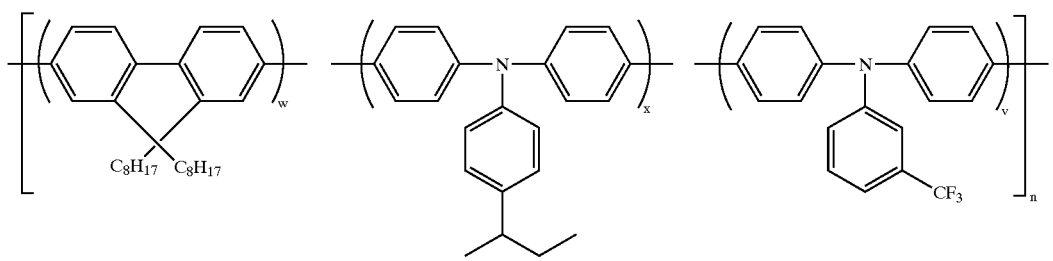

wherein w+x+v=1, w≧0.5, 0<(x+v)≦0.5 and n≧2.

50. An organic polymer according to claim 47, having a formula as shown in Formula XXXV:

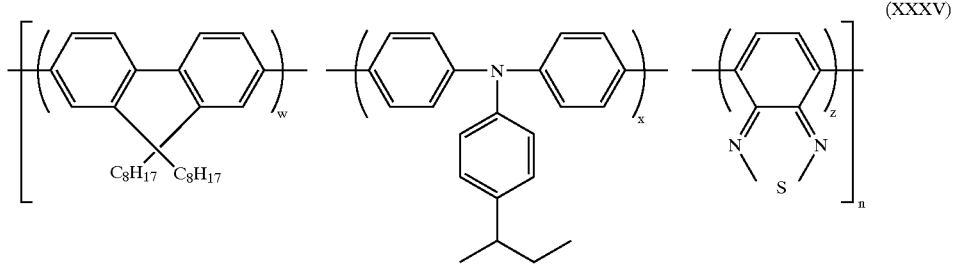

wherein w+x+z=1, w≧0.5, 0<(x+z)≦0.5 and n≧2.

51. An organic polymer according to claim 47, which is blended with a light emissive material.

52. An organic polymer according to claim 1, comprising:
   (i) a first region for transporting negative charge carriers and having a first bandgap defined by a first LUMO level and a first HOMO level; and
   (ii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first and third bandgaps are distinct from one another in the polymer.

53. An organic polymer according to claim 52, having a formula as shown in Formula XXXVI

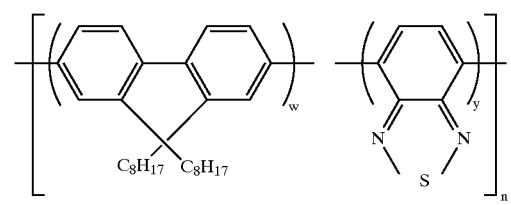

wherein w+y=1, w≧0.5 and 0<y≦0.5 and n≧2.

54. An organic polymer according to claim 52, which is blended with a hole transporting material.

55. An organic polymer according to claim 54, wherein the hole transporting material comprises a poly-triarylamine.

56. An organic polymer according to claim 1, comprising:
   (i) a second region for transporting positive charge carriers and having a second bandgap defined by a second LUMO level and a second HOMO level; and
   (ii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the second and third bandgaps are distinct from one another in the polymer.

57. An organic polymer according to claim 56, having a formula as shown in Formula XXXVII:

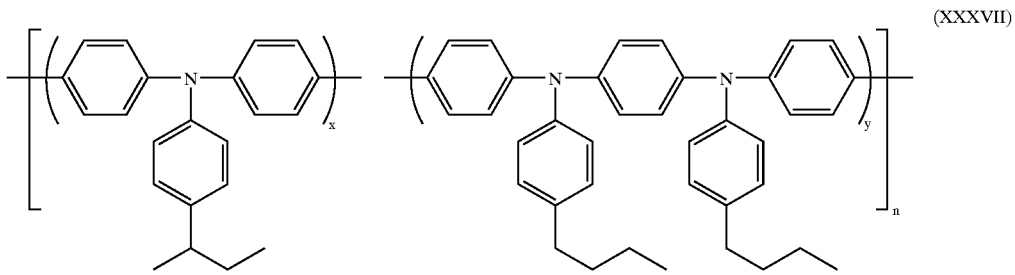

wherein x+y=1, x≧0.5 and 0<y≦0.5 and n≧2.

58. An organic polymer according to claim 56 which is blended with an electron transporting material.

59. An organic polymer according to claim 58, wherein the electron transporting material comprises poly-fluorene.

60. An optical device including a polymer according to claim 1.

61. The optical device according to claim 60, wherein the optical device comprises an electroluminescent device.

62. An electroluminescent device comprising an anode layer, a cathode layer and a layer of a polymer according to claim 1 situated between the anode layer and the cathode layer.

63. An electroluminescent device comprising an anode layer, a cathode layer, and a layer of an organic polymer situated between the anode layer and the cathode layer, the organic polymer having a plurality of regions along the length of the polymer backbone and comprising two or more of the following:

(i) a fast region for transporting negative charge carriers and having a first bandgap defined by a first LUMO level and a first HOMO level; and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer, and wherein the device includes an emissive material which may or may not be the third region, and the first LUMO level lies between a work function of the cathode and a LUMO level of the emissive material or which is matched to the LUMO level of the emissive material, and the second HOMO level lies between a work function of the anode and a HOMO level of the emissive material or which is matched to the HOMO level of the emissive material.

64. An organic polymer having a plurality of regions along the length of the polymer backbone and comprising two or more of the following:

(i) a first region for transporting negative charge carriers and having a first bandgap defined by a first LUMO level and a first HOMO level; and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer, wherein there is no cross-lining functionality on the polymer and wherein the third region comprises a group having the formula as shown in Formula IX or X:

(IX)

(X)

where $Ar_1$ and $Ar_2$ independently comprise a substituted or unsubstituted, fused or unfused, benzene, thiophene, furan, quinoxaline, biphenyl of fluorene group.

65. An organic polymer having a plurality of regions along the length of the polymer backbone and comprising two or more of the following:

(i) a first region for transporting negative charge carriers and having a first bandgap defined by a first LUMO level and a first HOMO level; and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer, wherein there is no cross-linking functionality on the polymer and wherein the third region comprises a group having the formula as shown in Formula VIII or XI:

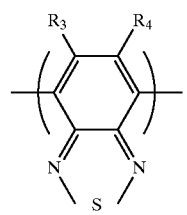(XI)

(VIII)

wherein X' is RC=CR or S and $R_1$ and $R_2$ are independently selected from hydrogen, alkyl, aryl, perfluoroalkyl, thioalkyl, cyano, alkoxy, heteroaryl, alkylaryl arylakyl, pyridine or furan and $R_3$ and $R_4$ are independently selected from alkyl, aryl, perfluoroalkyl, thioalkyl, cyano, alkoxy, heteroaryl, alkylaryl arylakyl, pyridine or furan.

66. The organic polymer of claim 65 wherein $R_1$, $R_2$, $R_3$, and $R_4$ are each a phenyl group.

67. The organic polymer of claim 65 wherein the third region comprises a group having the formula as shown in any one of Formulas XIII to XXVI:

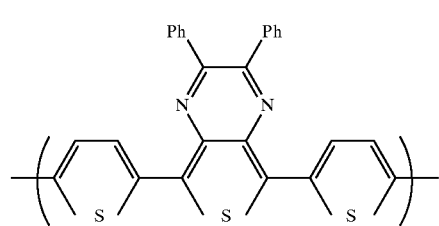(XIII)

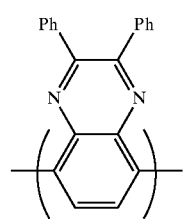(XIV)

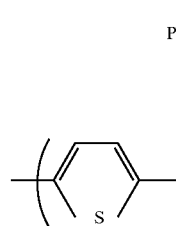(XV)

(XVI)
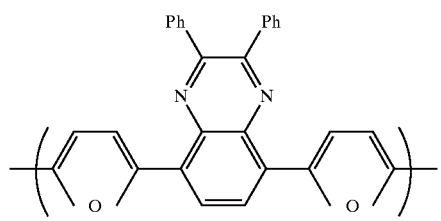

(XVII)
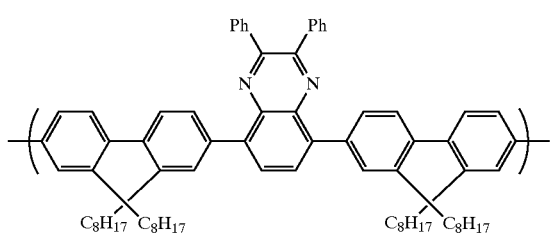

(XVIII)
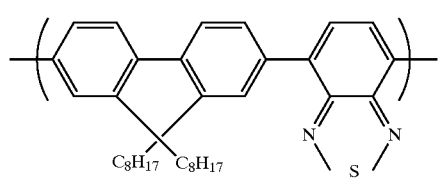

(XIX)
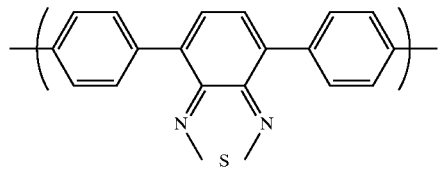

(XX)
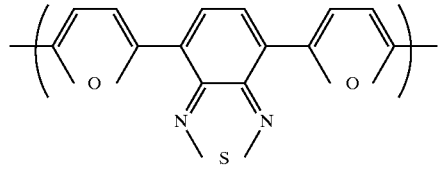

(XXI)
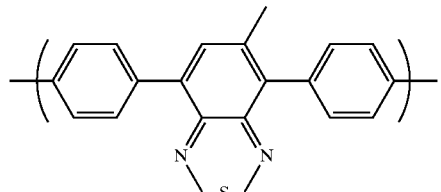

(XXII)
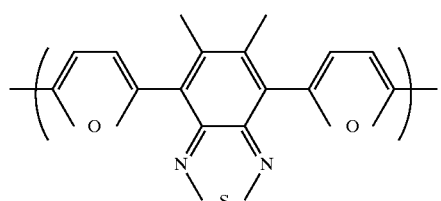

(XXIII)
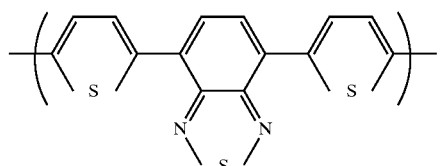

(XXIV)
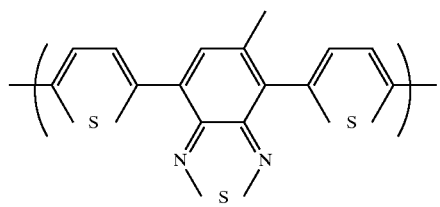

(XXV)
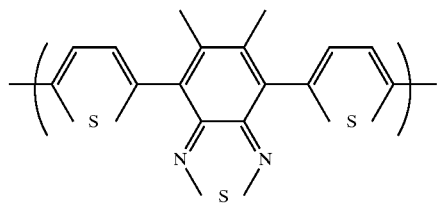

(XXVI)
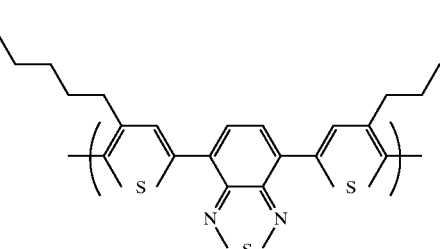

68. An organic polymer having a plurality of regions along the length of the polymer backbone and comprising all three of the following:

(i) a first region for transporting negative charge carriers and having a first bandgap defined by a first LUMO level and (ii) a second region for transporting positive charge carriers and having a second bandgap defined by a second LUMO level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer and having the formula:

(XXVIII)

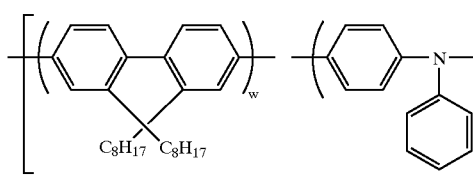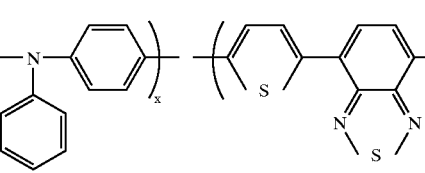

wherein w+x+y+z=1, w≧0.5, 0<(x+y+z)≦0.5 and n≧9.

69. An organic polymer having a plurality of regions along the length of the polymer backbone and comprising all three of the following:
  (i) a first region for transporting negative charge carriers and having a first bandgap defined by a first LUMO level and
  (ii) a second region for transporting positive charge carriers and having a second bandgap defined by a second LUMO level and a second HOMO level; and
  (iii) a third region for accepting and combining positive and negative charge carriers to generate light and having a third bandgap defined by a third LUMO level and a third HOMO level,
  wherein each region comprises one or more monomers and the quantity and arrangement of the monomers in the organic polymer is selected so that the first, second and third bandgaps are distinct from one another in the polymer and having the formula:

(XXIX)

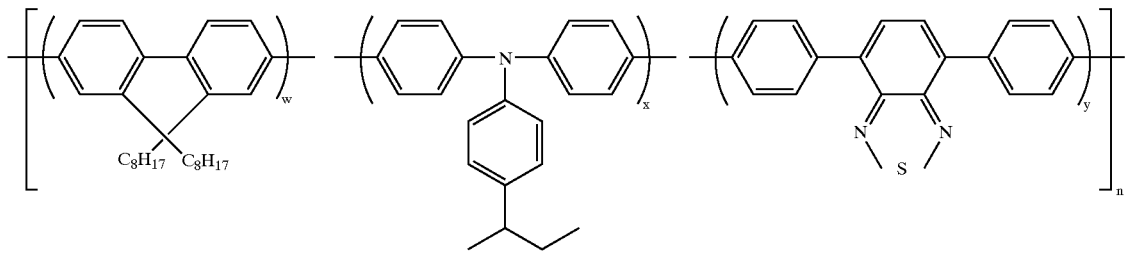

wherein w+x+y=1, w≧0.5, 0<(x+y)≦0.5 and n≧2.

70. An organic polymer having a plurality of regions along the length of the polymer backbone and comprising all three of the following:
  (i) a first region for transporting negative charge carriers and having a first bandgap defined by a first LUMO level and
  (ii) a second region for transporting positive charge carriers and having a second bandgap defined by a second LUMO level and a second HOMO level; and
  (iii) a third region for accepting and combining positive and negative charge carries to generate light and having a third bandgap defined by a third LUMO level and a third HOMO level,
  wherein each region comprises one or more monomers and the quantity and arrangement of the monomers in the organic polymer is selected so that the first, second and third bandgaps are distinct from one another in the polymer and having the formula:

(XXX)

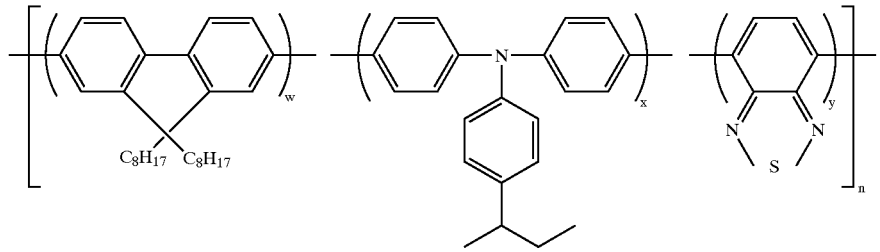

wherein w+x+y=1, w≧0.5, 0<(x+y)≦0 and n≧2.

71. An organic polymer having a plurality of regions along the length of the polymer backbone and comprising at least two of the following regions:
  (i) a first region for transporting negative charge carriers and having a first level and
  (ii) a second region for transporting positive charge carriers and having a second bandgap defined by a second LUMO level and a second HOMO level; and
  (iii) a third region for accepting and combining positive and negative charge carriers to generate light and having a third bandgap defined by a third LUMO level and a third HOMO level,
  wherein each region comprises one or more monomers and the quantity and arrangement of the monomers in the organic polymer is selected so that the first, second and third bandgaps are distinct from one another in the polymer and having the formula:

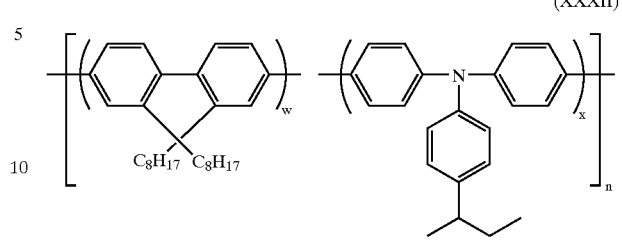
(XXXII)

(XXXI)

wherein w+x+y=1, w≧0.5, 0<(x+y)≦0.5 and n≧9.

72. An organic polymer having a plurality of regions along the length of the least two of the following regions:

(i) a first region for transporting negative charge carriers and having a first bandgap defined by a first LUMO level and (ii) a second region for transporting positive charge carriers and having a second level and a second HOMO level; and (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer and having one of the following formulas:

-continued

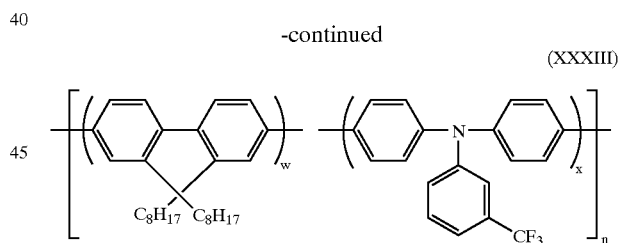
(XXXIII)

wherein w+x=1, w≧0.5, 0<x 5.5 and n≧2.

73. An organic polymer having a plurality of regions along the length of the polymer backbone and comprising at least two of the following regions:
  (i) a first region for transporting negative charge carriers and having a first bandgap defined by a first LUMO level and
  (ii) a second region for transporting positive charge carriers and having a second bandgap defined by a second LUMO level and a second HOMO level; and
  (iii) a third region for accepting and combining positive and negative charge carriers to generate light and having a third bandgap defined by a third LUMO level and a third HOMO level, wherein each region comprises one or more monomers and the quantity and arrangement of the monomers in the organic polymer is selected so that the first, second and third bandgaps are distinct from one another in the polymer and having the following formula:

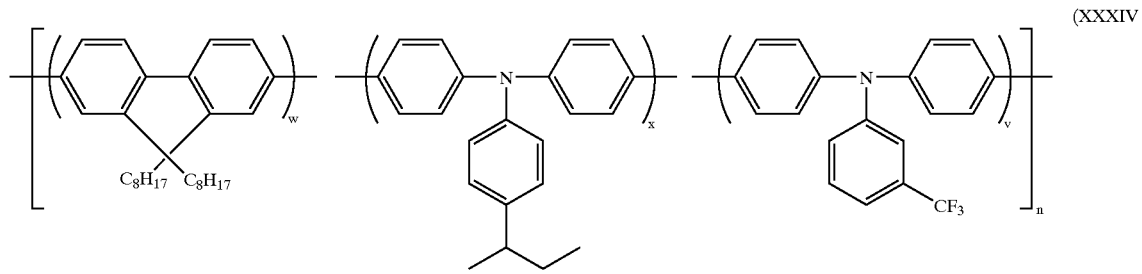

(XXXIV)

wherein $w+x+v=1$, $w \geq 0.5$, $0<(x+v)$ 0.5 and $n \geq 2$.

74. An organic polymer having a plurality of regions along the length of the east two of the following regions:
  (i) a first region for transporting negative charge carriers and having a first bandgap defined by a first LUMO level and
  (ii) a second region for transporting positive charge carriers and having a second bandgap defined by a second LUMO level and a second HOMO level; and
  (iii) a third region for accepting and combining positive and negative charge carriers to generate light and having bandgap define by a third LUMO level and a third HOMO level,
  wherein each region comprises one or more monomers and the quantity and arrangement of the monomers in the organic polymer is selected so that the first, second and third bandgaps are distinct from one another in the polymer and having the following formula:

wherein $w+x+z=1$, $w \geq 0.5$, $0<(x+z) \leq 0.5$ and $n \geq 2$.

75. An organic polymer having a plurality of regions along the length of the polymer backbone and comprising all three of the following:
  (i) a first region for transporting negative charge carriers and having a first bandgap defined by a first LUMO level and
  (ii) a second region for transporting positive charge carriers and having a second bandgap defined by a second LUMO level and a second HOMO level; and
  (iii) a third region for accepting and combining positive and negative charge carriers to generate light and having a third bandgap defined by a third LUMO level and a third HOMO level,
  wherein each region comprises one or more monomers and the quantity and arrangement of the monomers in the organic polymer is selected so that the first, second and third bandgaps are distinct from one another in the polymer having the formula:

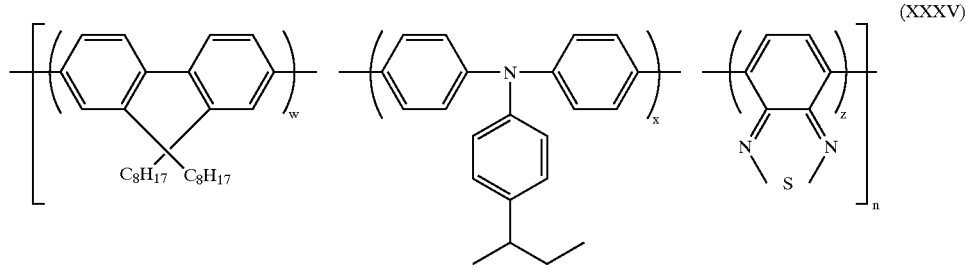

(XXXV)

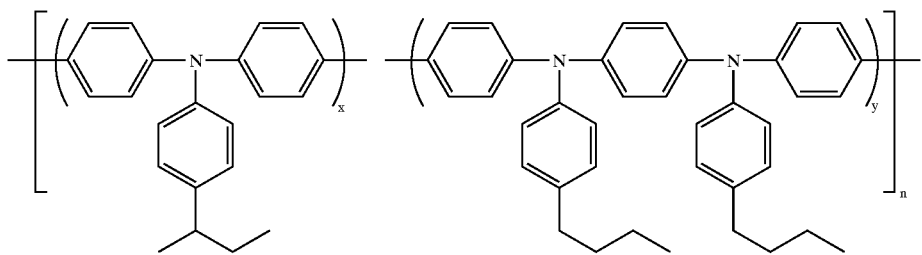
wherein x+y=1, x≧0.5 and 0<y≦0.5 and n≧2.
76. The polymer according to claim 75 which is blended with an electron transporting material.
* * * * *